US008409996B2

(12) United States Patent
Vanhelmont et al.

(10) Patent No.: US 8,409,996 B2
(45) Date of Patent: Apr. 2, 2013

(54) METHOD OF MANUFACTURING A BULK ACOUSTIC WAVE DEVICE

(75) Inventors: Frederik Willem Maurits Vanhelmont, Maaseik (BE); Rensinus Cornelis Strijbos, Nijmegen (NL); Andreas Bernardus Maria Jansman, Nuenen (NL); Robertus Adrianus Maria Wolters, Eindhoven (NL); Johannes van Wingerden, Hardinxveld-Giessendam (NL); Fredericus Christiaan van den Heuvel, Waalre (NL)

(73) Assignee: NXP B.V., Eindhoven (NL)

( * ) Notice: Subject to any disclaimer, the term of this patent is extended or adjusted under 35 U.S.C. 154(b) by 122 days.

(21) Appl. No.: 12/968,020

(22) Filed: Dec. 14, 2010

(65) Prior Publication Data

US 2011/0315654 A1 Dec. 29, 2011

(30) Foreign Application Priority Data

Dec. 15, 2009 (EP) .................................... 09179278

(51) Int. Cl.
*H01L 21/302* (2006.01)
(52) U.S. Cl. ........... 438/740; 438/692; 438/751; 216/13
(58) Field of Classification Search .................. 438/691, 438/692, 693, 694, 751, 740, 741; 216/13, 216/90, 102
See application file for complete search history.

(56) References Cited

U.S. PATENT DOCUMENTS

| 5,692,279 A | 12/1997 | Mang et al. |
| 6,864,619 B2 | 3/2005 | Aigner et al. |
| 8,138,855 B2 | 3/2012 | Jansman |
| 2002/0166218 A1 | 11/2002 | Barber et al. |
| 2005/0023932 A1 | 2/2005 | Inoue et al. |
| 2005/0034345 A1 | 2/2005 | Beretta |
| 2005/0130374 A1* | 6/2005 | Grynkewich et al. ......... 438/257 |
| 2006/0202779 A1* | 9/2006 | Fazzio et al. .................. 333/187 |
| 2007/0036897 A1 | 2/2007 | Linska et al. |
| 2009/0067774 A1* | 3/2009 | Magnusson ..................... 385/10 |

FOREIGN PATENT DOCUMENTS

| EP | 0 973 256 A1 | 1/2000 |
| JP | 1-071208 A | 3/1989 |
| WO | 2005/034345 A1 | 4/2005 |
| WO | 2006/126168 A1 | 11/2006 |
| WO | 2007/036897 A2 | 4/2007 |
| WO | 2009/133511 A1 | 11/2009 |

OTHER PUBLICATIONS

Extended European Search Report for European Patent Appln. No. 09179278.8 (Jan. 18, 2011).
F. Engelmark et al., "Selective etching of Al/AlN structures for metallization of surface acoustic wave devices," J. Vac. Sci. Technol. B, vol. 20, No. 3, pp. 843-848 (2002).
Kaitila, J. "Review of Wave Propagation in BAW Thin Film Devices Progress and Prospects", IEEE Ultrasonics Symposium, pp. 120-129 (2007).

* cited by examiner

*Primary Examiner* — Lan Vinh

(57) ABSTRACT

A method of manufacturing a Bulk Acoustic Wave device by providing an active layer formed of an electro-mechanical transducer material, providing a first electrode on the active layer, defining a first electrode portion of the device, whereby a remaining portion of the device is defined around the first electrode, providing a stop-layer on the first electrode, depositing a first dielectric layer on the resultant structure, and planarizing the first dielectric layer until the stop-layer on the first electrode is exposed.

13 Claims, 21 Drawing Sheets

- Al
- SiO2
- AlN
- Bottom Electrode
- High-impedance layer
- Low impedance layer

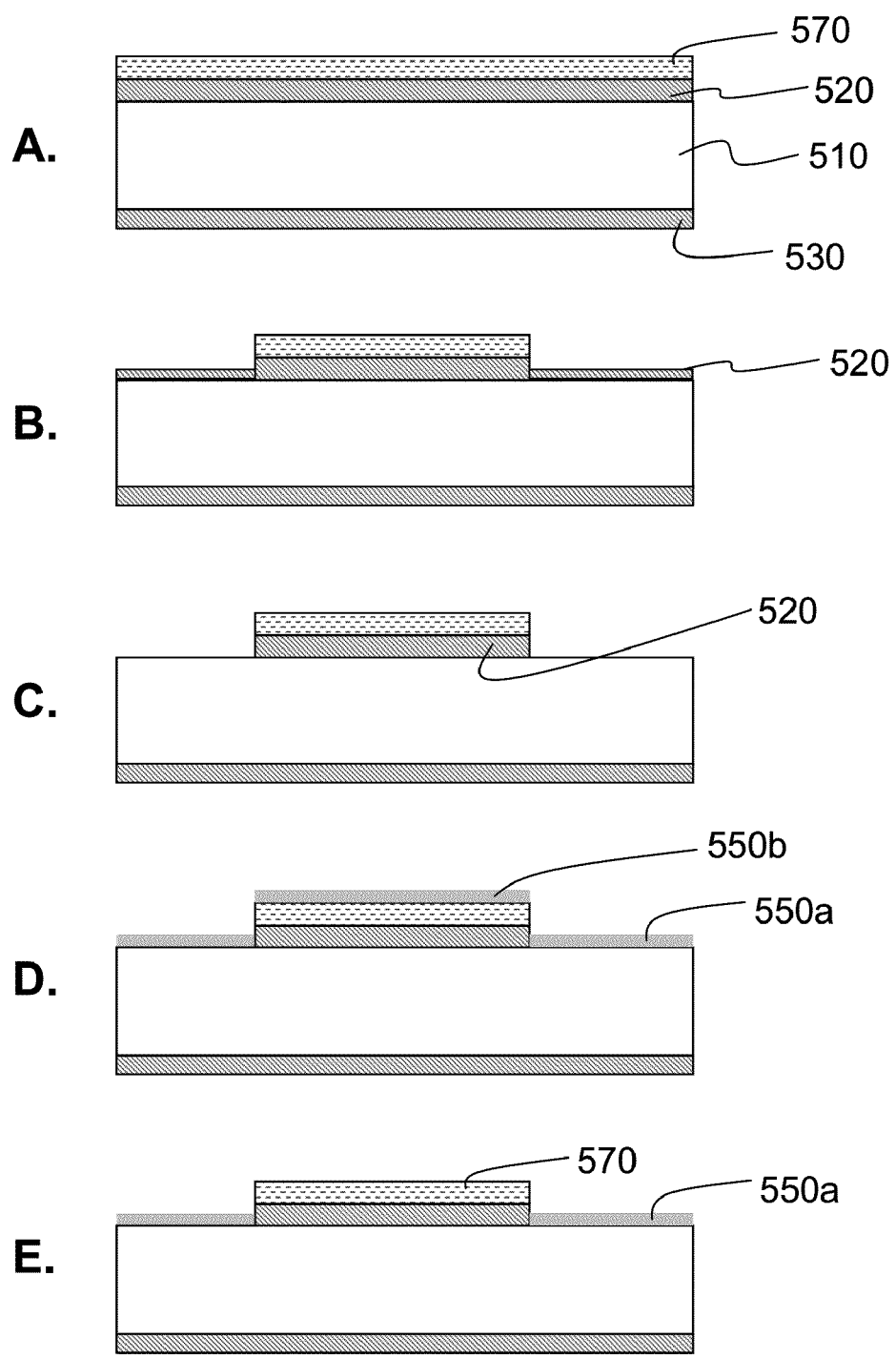
FIG 23A-E

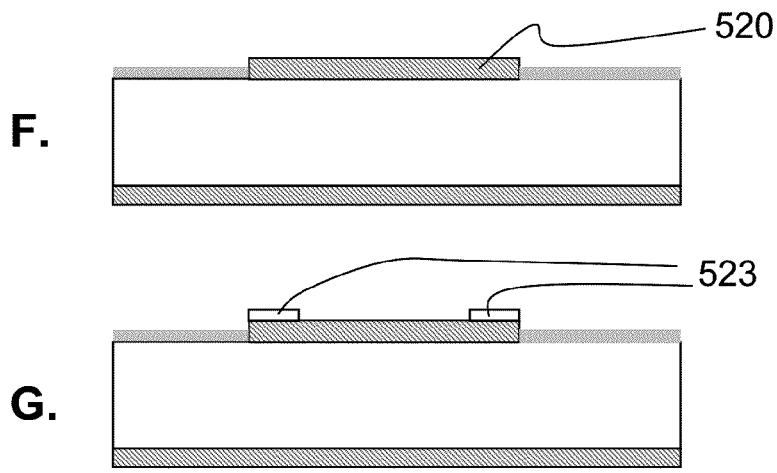
FIG 23F-G
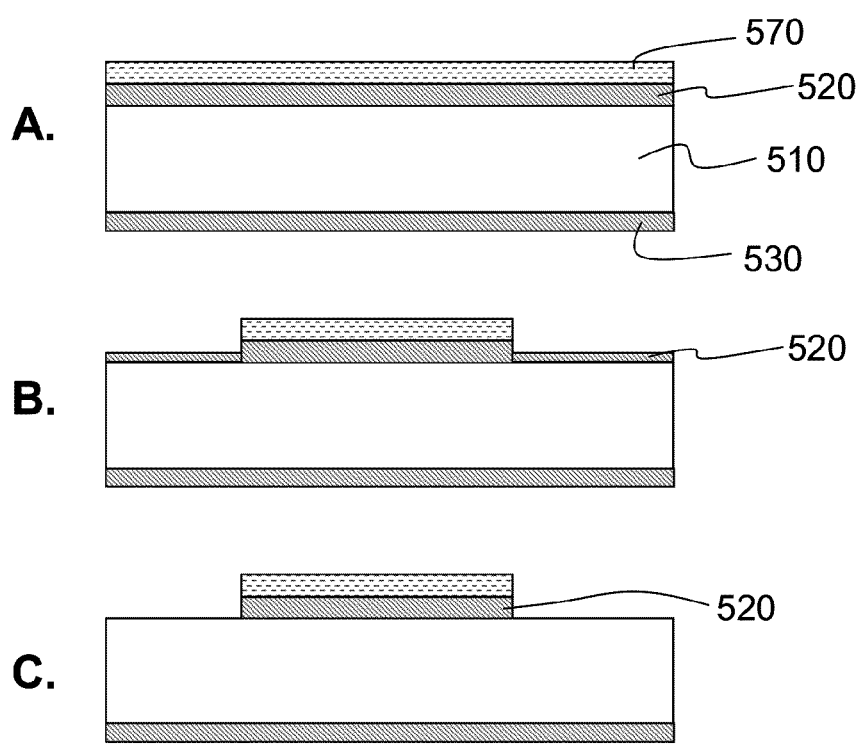
FIG 24A-C

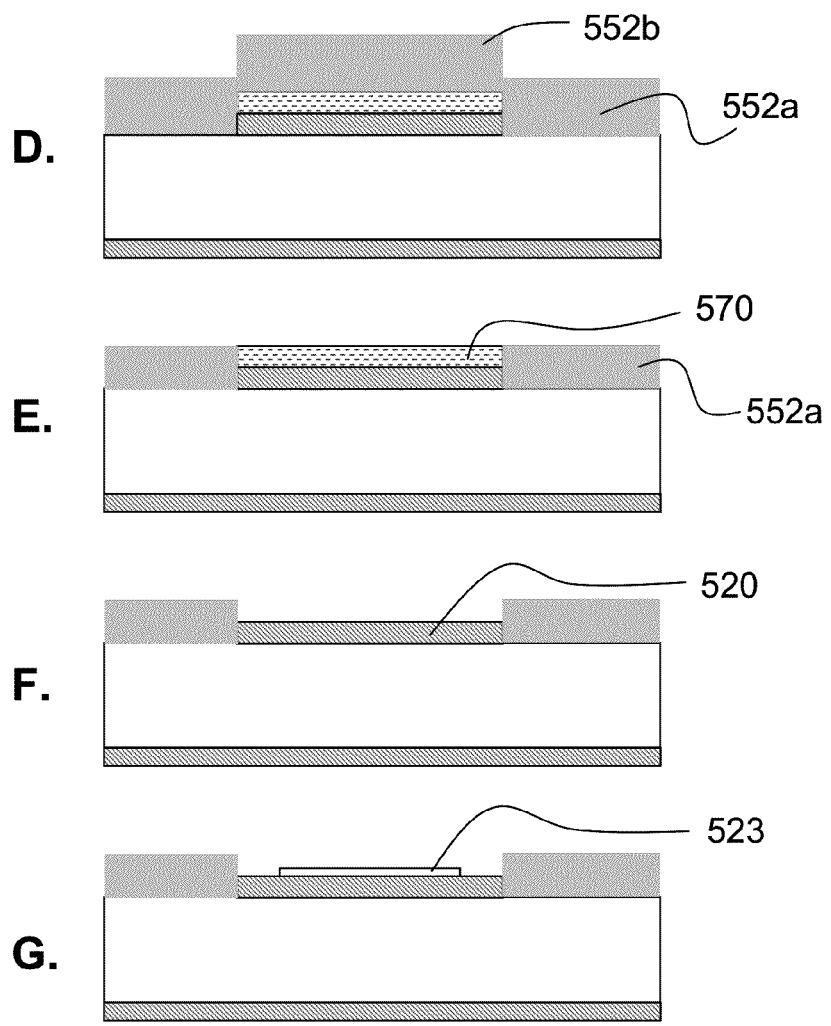
FIG 24D-G
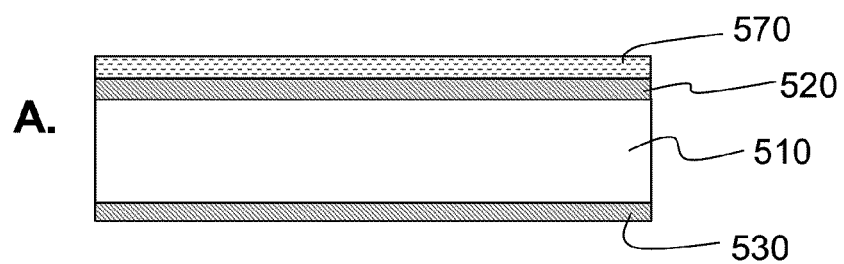
FIG 25A

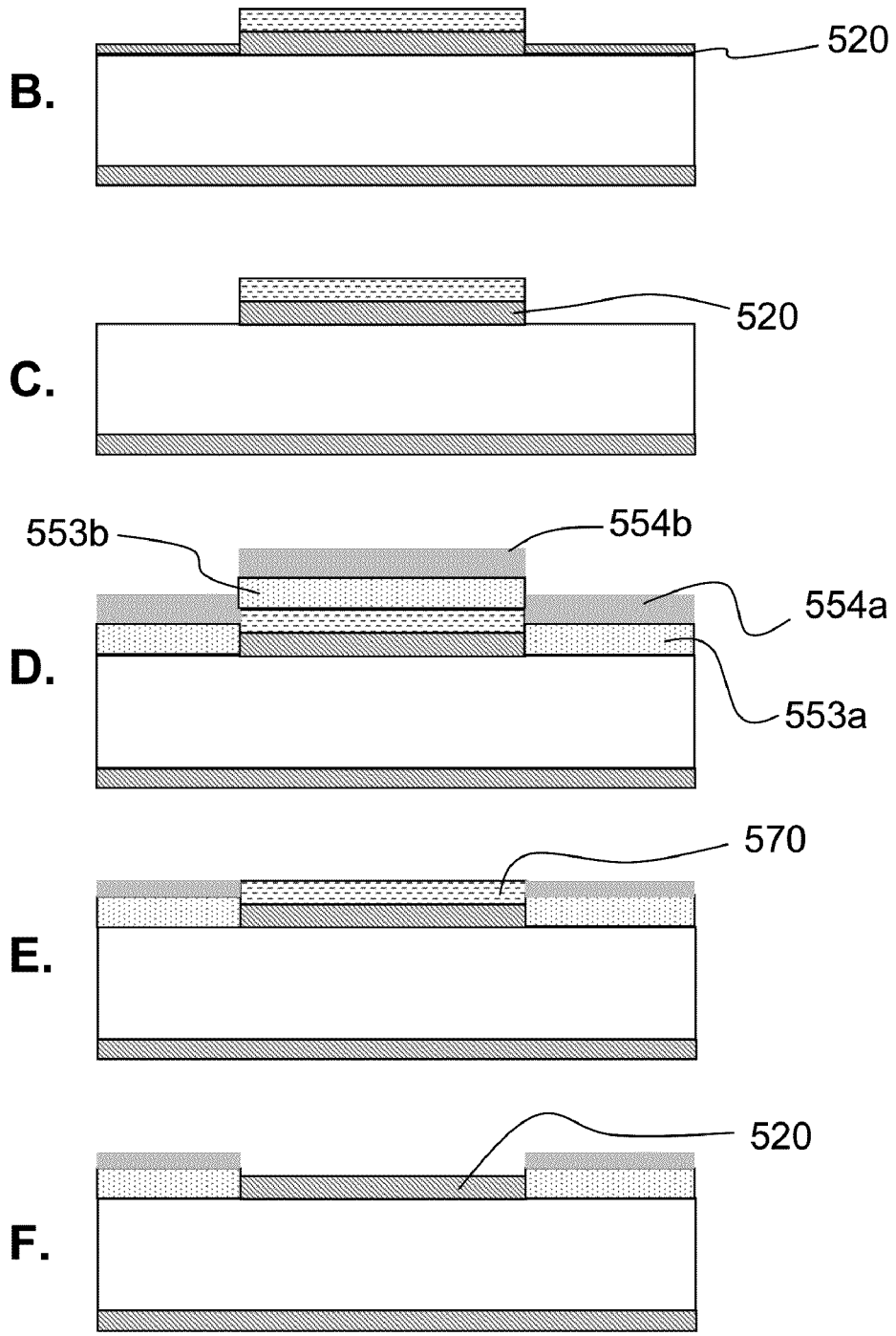
FIG 25B-F

METHOD OF MANUFACTURING A BULK ACOUSTIC WAVE DEVICE

This application claims the priority under 35 U.S.C. §119 of European patent application no. 09179278.8, filed on Dec. 15, 2009, the contents of which are incorporated by reference herein.

FIELD OF THE INVENTION

This invention relates to methods for manufacturing bulk acoustic wave devices. In particular, it relates to methods for manufacturing laterally coupled bulk acoustic wave devices.

BACKGROUND OF THE INVENTION

For mobile communication applications with high demands on Radio-Frequency (RF) filter selectivity, thin-film Bulk Acoustic Wave (BAW) filters are the technology of choice. Examples of this trend include narrow band CDMA and WCDMA mobile devices equipped with BAW filters. Such filters are particularly suitable for communication standards with carrier frequencies above 1 GHz and having stringent specifications on frequency selectivity.

An additional desirable feature for a BAW device is transformation of an unbalanced input signal into two balanced output signals. This action is called "balun" (balanced-to-unbalanced or vice versa) functionality. If a circuit utilises conventional BAW devices for filtering, then a separate balun component is required. Balun functionality was, in the past, traditionally achieved by magnetic coupling—using a transformer. As is well known, the DC levels at either side of a transformer can be chosen independently. It is desirable to provide similar decoupling using acoustic coupling between BAW devices, rather than magnetic coupling between transformer coils.

One proposal to achieve integrated balun functionality is the acoustically-coupled BAW. Two variations of this idea have been proposed: vertically and laterally coupled BAWs. The vertical version (hereinafter VBAW) is difficult and expensive to produce. On the other hand, laterally coupled BAWs (hereinafter LBAWs) are potentially cheap, but good performance devices have not been reported: neither good frequency selectivity, nor balun functionality have been shown for LBAWs.

Even without the added feature of balun functionality, acoustically coupled BAW filters have benefits for design flexibility: by adding shunt capacitances, the designer has full control of the notches outside the pass-band, whereas in conventional BAW filters they are fixed by the device technology.

It is therefore desired to produce a BAW device—and in particular a coupled BAW device—having good frequency selectivity properties, which is also easy and inexpensive to manufacture.

SUMMARY OF THE INVENTION

According to an aspect of the current invention, there is provided a method of manufacturing a Bulk Acoustic Wave device, comprising: providing an active layer formed of an electro-mechanical transducer material; providing a first electrode on the active layer, defining a first electrode portion of the device, whereby a remaining portion of the device is defined around the first electrode; providing a stop-layer on the first electrode; depositing a first dielectric layer on the resultant structure; and planarizing the first dielectric layer until the stop-layer on the first electrode is exposed.

The dispersion characteristics of BAW devices are sensitive, to variations in the relative thicknesses of the different portions of the device—and in particular to the thickness of the top layer of each portion. Since the dispersion characteristics determine the mechanical parameters of the device, it is important to have precise control over thickness, in order to ensure good frequency selectivity.

The present inventors have recognised a problem in the manufacture of BAW and LBAW devices when a planarization step is typically used to remove excess dielectric deposited over the electrode (to expose the electrode again). The planarization should stop as soon as the dielectric has been removed, without removing any of the underlying electrode material. However, this is difficult to achieve—especially if the electrode is relatively soft compared with the dielectric. This is the case with an aluminium electrode, for example.

According to the present process, an additional stop-layer is provided over the electrode, to protect it. Therefore, the unintended thinning of the electrode layer is avoided. The stop layer may be formed of a harder material than the underlying electrode, so that it is less likely to be thinned unintentionally during planarization. However, this is not essential.

The active layer may be a piezoelectric layer, although other electro-mechanical transducer materials, such as piezoresistive materials, may also be used.

The method may further comprise removing the stop-layer by etching.

The stop-layer may be a sacrificial layer, in that it is removed after the planarization process has been completed.

A thickness of the first dielectric layer deposited in the remaining portion may be less than a thickness of the first electrode.

This is a typical configuration suitable for a device with a Type-I dispersion characteristic. The planarization does not affect the dielectric layer in the remaining portion, because the height of the layer in this region is below the level at which planarization stops.

Alternatively, a thickness of the first dielectric layer deposited in the remaining portion may be greater than a thickness of the first electrode.

Conventionally, when planarization is used in BAW device fabrication, the dielectric thickness is limited to being less than or equal to the electrode thickness, because the electrode itself is being used as the indicator or stop-layer. This places limitations on the design of the device and its frequency characteristics. With the present method, however, a separate stop layer is provided on top of the electrode. This means that the dielectric in the remaining portion can be thicker that the electrode.

More specifically, the thickness of the dielectric layer deposited in the remaining portion may be greater than a combined thickness of the first electrode and the stop-layer, whereby part of the dielectric layer in the remaining portion is removed by the planarization.

In this case, when planarization is completed, the height of the top surface of the dielectric is equal to the sum of the electrode thickness and the stop-layer thickness. Thus, the thickness of the dielectric layer is determined by the sum of the thicknesses of the electrode and stop-layer. It is brought to its final thickness by the planarization process, instead of the process of depositing the dielectric. This may give enhanced control of thickness. The difference in height between the electrode portion and remaining portion is determined by the thickness of the stop-layer. It is preferable that the stop-layer is relatively hard, so that it is not partially removed by the planarization. This will ensure that the end point of the planarization process—and therefore the thickness of the dielectric layer—is determined accurately.

The step of providing the first electrode may comprise: providing a conductive layer on the active layer; and patterning the conductive layer by etching to define the first electrode, wherein the etching of the conductive layer includes: a first anisotropic etching step; followed by a second isotropic etching step.

The present inventors have identified another problem of conventional BAW manufacturing methods, which also leads to poor control of layer thicknesses. When patterning the electrode on the active layer, part of the active layer itself may be removed. This causes the thickness of the device in the remaining portion (the portion around the electrode) to be changed by an unknown amount. The present processing method can reduce this unwanted variation, by patterning the electrode in two steps. The first step is an anisotropic (directional) etching step, such as dry plasma etching. The first etching step does not expose the underlying active layer, but leaves a thin layer of the conductive layer intact. The second etching step is isotropic (non-directional). The etchant (for example, chlorine gas) will etch the conductive material more selectively in the isotropic mode. Therefore, there is less likelihood of significant, unintended etching of the active layer.

Note that the stop-layer and conductive layer are typically patterned in the same process step, although this is not essential.

The method may further comprise depositing a second dielectric layer on the first dielectric layer, wherein the second dielectric layer is formed of a material having a different acoustic impedance to the first dielectric layer.

This can allow more precise control of the dispersion characteristics, because both the thicknesses of layers and their acoustic properties can be controlled. Acoustic impedance is related to the density of a material.

The method may further comprise depositing an additional layer on the first electrode.

This enables the dispersion characteristics in the electrode region—or a part of the electrode region—to be modified. For example, in order to trap the desired modes of vibration, it may be advantageous to provide a frame region of a different layer structure at the extremities of the electrode.

The Bulk Acoustic Wave device may be adapted for acoustic coupling of signals at frequencies in a desired pass-band, and a thickness of the first dielectric layer in the remaining portion may be adapted such that the wave number for at least one desired eigenmode having an eigenfrequency within the pass-band is an imaginary number, so as to increase the quality factor of said desired eigenmode and reduce insertion loss in the pass-band.

By designing the device to have this dispersion characteristic, the layer stack of the device is adapted so that the desired eigenmode is trapped by the remaining portion (the external region around the electrode). This provides improved pass-band characteristics when the BAW device is used as a filter.

The method may further comprise providing a second electrode on the active layer, defining a second electrode portion of the device, whereby a gap portion of the device is defined between the first and second electrodes and the remaining portion of the device is defined around the electrodes.

In this way, the method can be used to produce LBAW devices, having more than one top electrode.

The method may further comprise adjusting a thickness of the first dielectric layer in the gap portion or a thickness of the first dielectric layer in the remaining portion, so that they are different.

This provides an additional degree of freedom in the device design. The layer structure of the gap can be made different to that of the remaining portion of the device. This can lead to enhanced bandwidth of the pass-band.

The Bulk Acoustic Wave device is optionally adapted for acoustic coupling of signals at frequencies in a desired pass-band, wherein a thickness of the first dielectric layer in the gap portion is adapted such that the wave number for at least one desired eigenmode having an eigenfrequency within the pass-band is a real number.

This means that the wave function corresponding to the desired eigenmode has a propagating characteristic in the gap region as well as in the electrode region.

Planarizing the first dielectric layer preferably comprises Chemical Mechanical Polishing (CMP).

Also provided is a device fabricated according to the method of any preceding claim.

BRIEF DESCRIPTION OF THE DRAWINGS

The invention will now be described by way of example, with reference to the accompanying drawings, in which:

FIGS. 23A-G show, schematically, stages in a method of manufacturing a BAW device according to a first embodiment of a fourth aspect of the invention;

FIGS. 24A-G show a method according to a second embodiment of the fourth aspect; and FIGS. 25A-F show a method according to a third embodiment of the fourth aspect.

Figure 1:
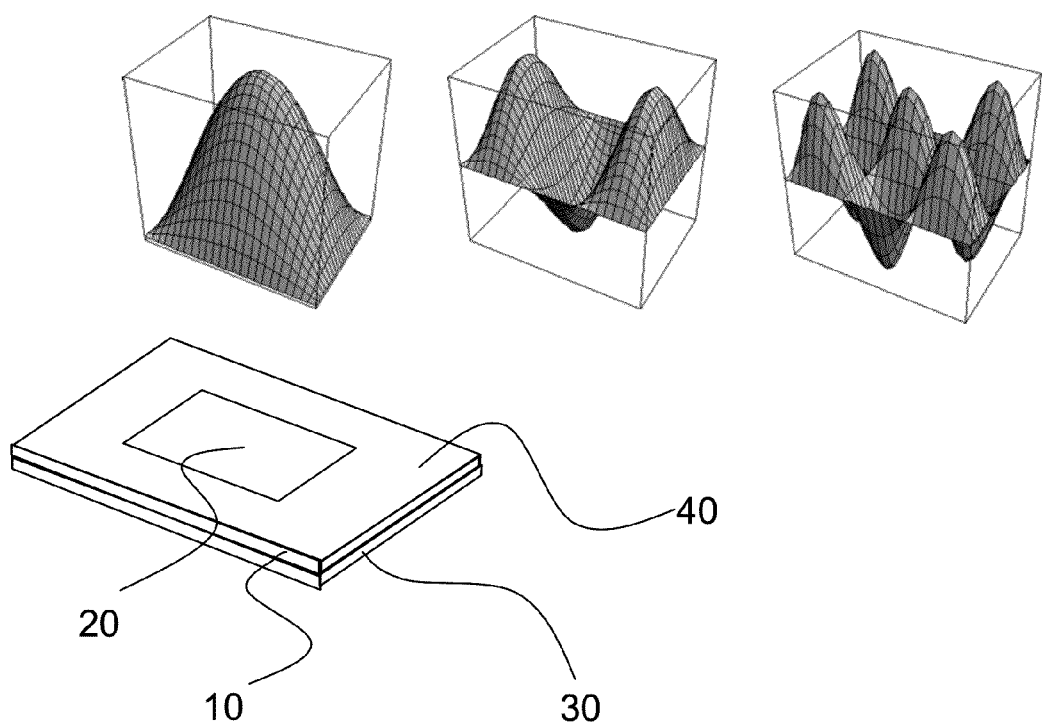
FIG. 1 shows a conventional BAW resonator and the first three associated eigenmode shapes.

The drawings are purely for explanatory purposes: dimensions are not drawn to scale; relative dimensions may be exaggerated; and where material properties are shown on graphs, the values indicated are not necessarily those of real devices.

DETAILED DESCRIPTION OF EMBODIMENTS

The design of vertically-coupled BAW filters is relatively straightforward. The required inter-resonator coupling-strengths can be calculated from standard filter theory. Once these parameters are known, one-dimensional simulations can be used to design the layer stack of a device providing the required coupling. The lateral layout is then easily determined based on the required impedance.

Unfortunately, the realization of filters of this type is rather impractical. It is essential that the stacked resonators have a resonance frequency exactly matched to the desired filter frequency. Furthermore, vertical coupling necessarily requires many layers: at least two piezoelectric layers, as well as electrodes, and coupling layers (typically three). A more cost-effective alternative to vertical coupling is therefore desirable.

To avoid the problems associated with VBAW filters, embodiments of the current invention provide improved designs for laterally-coupled BAW filters. In particular, the invention addresses the poor frequency selectivity of previously proposed LBAW devices. Embodiments of the invention also provide improved methods for manufacturing both regular BAW and LBAW devices.

In lateral coupling arrangements, BAW resonators are placed next to each other. Both resonators are implemented in the same piezoelectric layer and electrode layers. This has two advantages: firstly, fewer layers are required; secondly, since the two resonators are formed in the same layer, they always have identical thickness and, as a result, their resonance frequencies are automatically matched. This property makes the fabrication of LBAWs much less dependent on variable process-parameters. Thus the manufacture of laterally coupled LBAWs will be much less demanding (and, correspondingly, less expensive) than that of vertically coupled BAWs. The principal obstacle preventing realisation of these devices is the difficulty of designing an LBAW device with the required characteristics.

The first aspect of the invention will now be described.

The current inventors have recognised that the design of a suitable LBAW device depends on the careful selection of the modes of vibration which can be excited in the device. This depends not only on the layer structure (layer stack) and lateral layout of the coupled resonators, but also on the surrounding regions of the device. Thus, careful control of the surrounding, external region in the vicinity of the resonator is as important as the design of the resonator portion itself.

An LBAW filter consists of resonators which have mutual coupling. In the absence of such coupling (for example, if two resonators are widely separated), each resonator has its own eigenmodes. The natural modes of vibration (eigenmodes) of a single isolated BAW resonator will now be described.

Each eigenmode is associated with an eigenfrequency. If a large rectangular BAW resonator resonates in its fundamental mode, the particle displacement is strongest in the centre of the resonator and weak at the edges. This is illustrated in FIG. 1, which shows a simplified diagram of a BAW device. This comprises a piezoelectric layer 10, with a top electrode 20 and bottom electrode 30. The top electrode defines the extent of the active part of the resonator and also defines a remaining (external) portion 40 of the device outside the electrode region.

The dependence of particle displacement on lateral dimension x follows a sinusoidal dependence. If the region surrounding the resonator (the external region) has acoustically sufficient resemblance with the electrode region, then there will be some particle vibration in the direct vicinity of the resonator edge as well. Typically, the amplitude of this vibration decays exponentially with the distance beyond the electrode edge. The eigenmodes which can be sustained in a device having a given design and given material characteristics are known as "trapped" eigenmodes. The trapped eigenmodes of a stand-alone BAW resonator consist of a sinusoidal dependence on x for the electrode region and exponential decaying dependence on x for the external region. FIG. 1 illustrates three such eigenmodes.

The mode shapes of the eigenmodes can be derived as follows. It is convenient to describe the acoustic behaviour of a BAW layer stack in the x-z plane. Here, z is the vertical axis (out of the plane of the layer stack); and x is one of the horizontal axes. It is also convenient to describe this behaviour in terms of guided modes. In a guided mode, the dependence of vertical particle displacement $u_3$ on x and z is separated as follows:

$$u_3(x,z,t)=u_{3,0}(z)\exp(j(k_x x-\omega t))$$

Here, $\omega$ is the radial frequency; and $u_{3,0}(z)$ is a function of vertical position z only. The dependence of $u_3$ on lateral position x has the form $\exp(j k_x x)$. In fact, not only the vertical displacement, but all acoustic properties (for example, lateral displacement and stress) also follow this dependence on x.

Given a certain frequency there is only a limited set of guided modes that are supported by the layer stack. The supported guided modes can be presented in the form of a set of dispersion curves. A dispersion curve is a plot of radial frequency against the wave number associated with a supported eigenmode. The convention is to place imaginary wave numbers on the negative x-axis and real wave numbers on the positive x-axis of the graph. Radial frequency is plotted on the y-axis of the graph.

Figure 2:
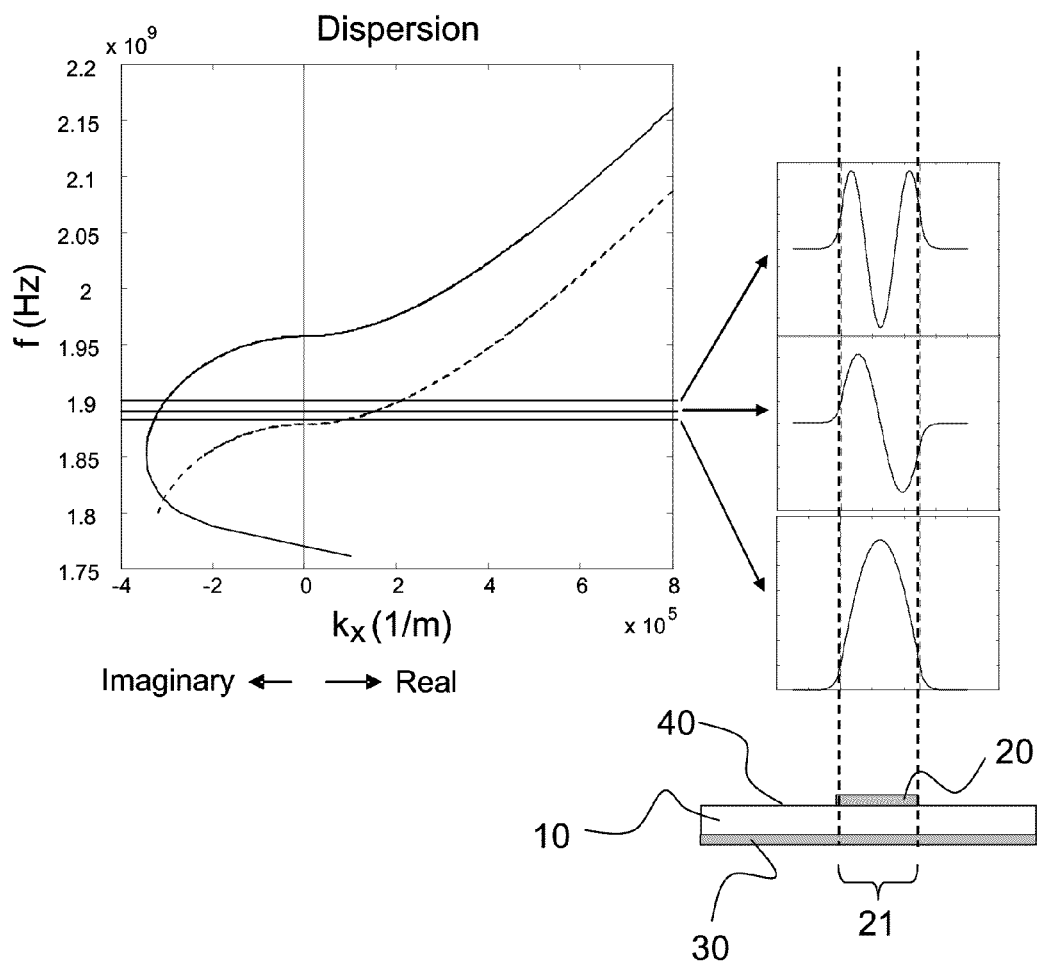
FIG. 2 shows the dispersion characteristics of the device illustrated in FIG. 1 and illustrates the correspondence of the mode-shapes (in two dimensions) with the dispersion plot.

In FIG. 2, the dispersion curves for the electrode region (dashed line) and the external region (solid line) are given. They are different from one another, because the regions have a different layer stack—at a minimum, one of the top or bottom electrodes is absent from the external region. Each dispersion curve crosses the y-axis at one or more so-called "cut-off" frequencies. The most interesting frequency regime is immediately above the fundamental Thickness-Extensional (TE1) cut-off frequency of the electrode region. For the type-I dispersion in FIG. 1, this is the upper cutoff frequency. In this regime, the electrode region has a real wave number, so the dependence $\exp(jk_{x,elec}x)$ becomes a sinusoid $\sin(k_{x,elec}x)$. In the external region, the wave number in the interesting frequency regime is imaginary, so for this region $\exp(jk_{x,ext}x)$ becomes $\exp(-K_{x,ext} x)$ where $K_{x,ext}$ equals the imaginary part of $k_{x,ext}$.

Based on this model, it is possible to synthesize an eigenmode and derive the corresponding eigenfrequency for a resonator of finite dimensions. Assuming dispersion curves for the resonator's electrode region 21 and external region as shown in FIG. 2, such a synthesized eigenmode has the following shape:

$$u_3(x, z) = \begin{cases} P_{left} u_{3,0,gap}(z)\exp(K_{x,ext}x) & \text{for the ext. region at the left side of the resonator} \\ P_{elec} u_{3,0,elec}(z)\sin(k_{x,elec}x) & \text{for the electrode region} \\ P_{right} u_{3,0,gap}(z)\exp(-K_{x,ext}x) & \text{for the ext. region at the right side of the resonator} \end{cases}$$

$P_{left}$, $P_{elec}$ and $P_{right}$ are complex constants. This $u_3(x,z)$ is only a true eigenmode under the following conditions:
- $u_3(x,z)$ is continuous at the boundaries between resonator and external region
- The partial derivative of the function with respect to x, $\partial u_3(x,z)/\partial x$, is continuous at these boundaries
- $K_{x,ext}$ and $k_{x,elec}$ relate to the same frequency (that is, the same vertical location in the dispersion graph)

Based on these conditions, the values of the complex constants $P_{left}$, $P_{elec}$ and $P_{right}$ can be calculated.

Only a discrete set of eigenmodes can be found that fulfil all these conditions. The first three such eigenmodes are shown to the right of the dispersion plot in FIG. 2.

To summarise the conditions derived above: for a mode to be trapped, the electrode region must exhibit a real-valued wave number at the relevant eigenfrequency, while the external region must present a complex-valued wave number at the same frequency.

Figure 3:
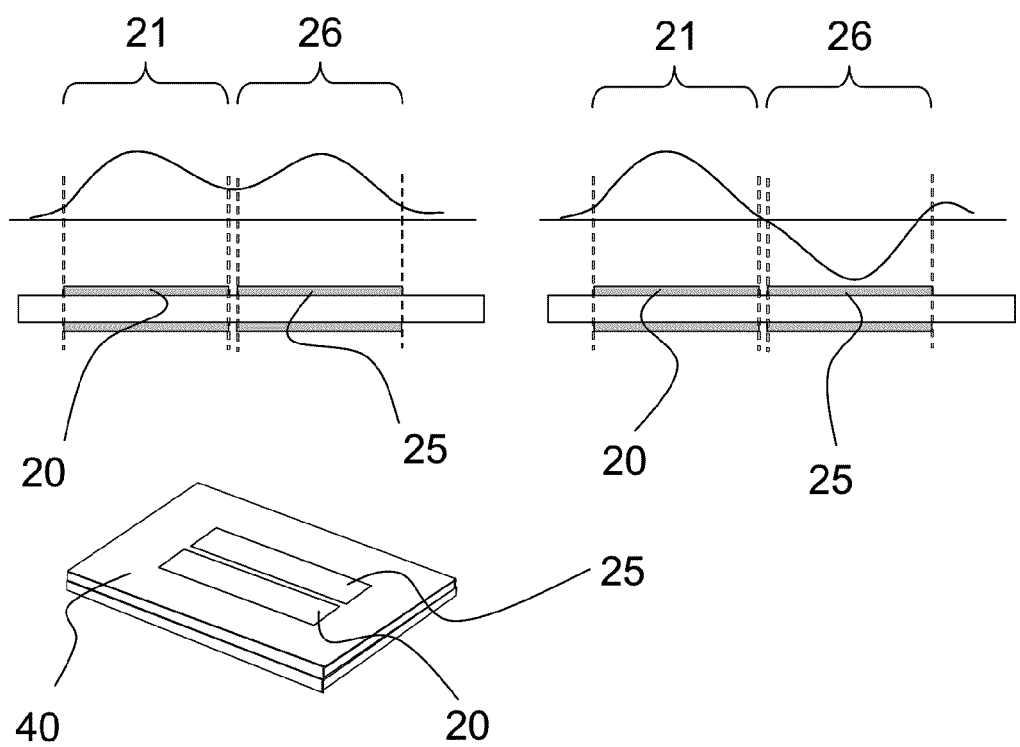
FIG. 3 shows a simple example of a laterally-coupled BAW device comprising two resonators, and an illustration of its fundamental mode-shapes in two dimensions.

The natural modes of vibration (eigenmodes) of a pair of laterally-coupled BAW resonators will now be described, with reference to FIG. 3. A second BAW resonator is placed so close to the first resonator that one of its edges is within the exponentially decaying tail of the first resonator. The first and second resonators 21, 26 are defined by their corresponding electrodes 20, 25, respectively. The two resonators are said to be coupled: the system of two resonators has eigenmodes that are different from the eigenmodes of the individual resonators. For this LBAW system, the eigenmodes again consist of sinusoidal dependencies in the electrode areas 21, 26 and exponential functions in the non-electrode region, decaying from the edge. In the gap between the resonators, exponentially decaying functions come from both sides. Given the boundary conditions at each interface between electrode and non-electrode regions, the eigenmodes can again be derived, but now for the system of coupled resonators. As before, each eigenmode has its associated eigenfrequency. FIG. 3 shows two eigenmodes of such an LBAW resonator consisting of two coupled resonators. The plots indicate the particle displacement associated with each eigenmode. Note that these two eigenmodes are fundamentally different from one another. In the first (shown on the left), the particles in the first resonator and second resonator vibrate in phase. In the second (shown on the right), they vibrate in anti-phase.

To find the eigenmodes of LBAW resonators, the formula used above for $u_3(x,z)$ for a single isolated resonator can be extended. The only difference is that the number of regions increases. For two coupled resonators there are five regions: external regions to the left and right of the device; a gap region between the resonators; and the two electrode regions themselves. The eigenmode has the following shape:

$$u_3(x, z) = \begin{cases} P_{left} u_{3,0,ext}(z)\exp(K_{x,ext}x) & \text{for the ext. region at the left side of the resonator} \\ P_{elec,1} u_{3,0,elec}(z)\sin(k_{x,elec}x) & \text{for the first electrode region} \\ P_{gap,1} u_{3,0,ext}(z)\exp(-K_{x,ext}x) + P_{gap,2} u_{3,0,ext}(z)\exp(K_{x,ext}x) & \text{for the gap region} \\ P_{elec,1} u_{3,0,elec}(z)\sin(k_{x,elec}x) & \text{for the first electrode region} \\ P_{right} u_{3,0,gap}(z)\exp(-K_{x,ext}x) & \text{for the ext. region at the right side of the resonator} \end{cases}$$

Figure 4:
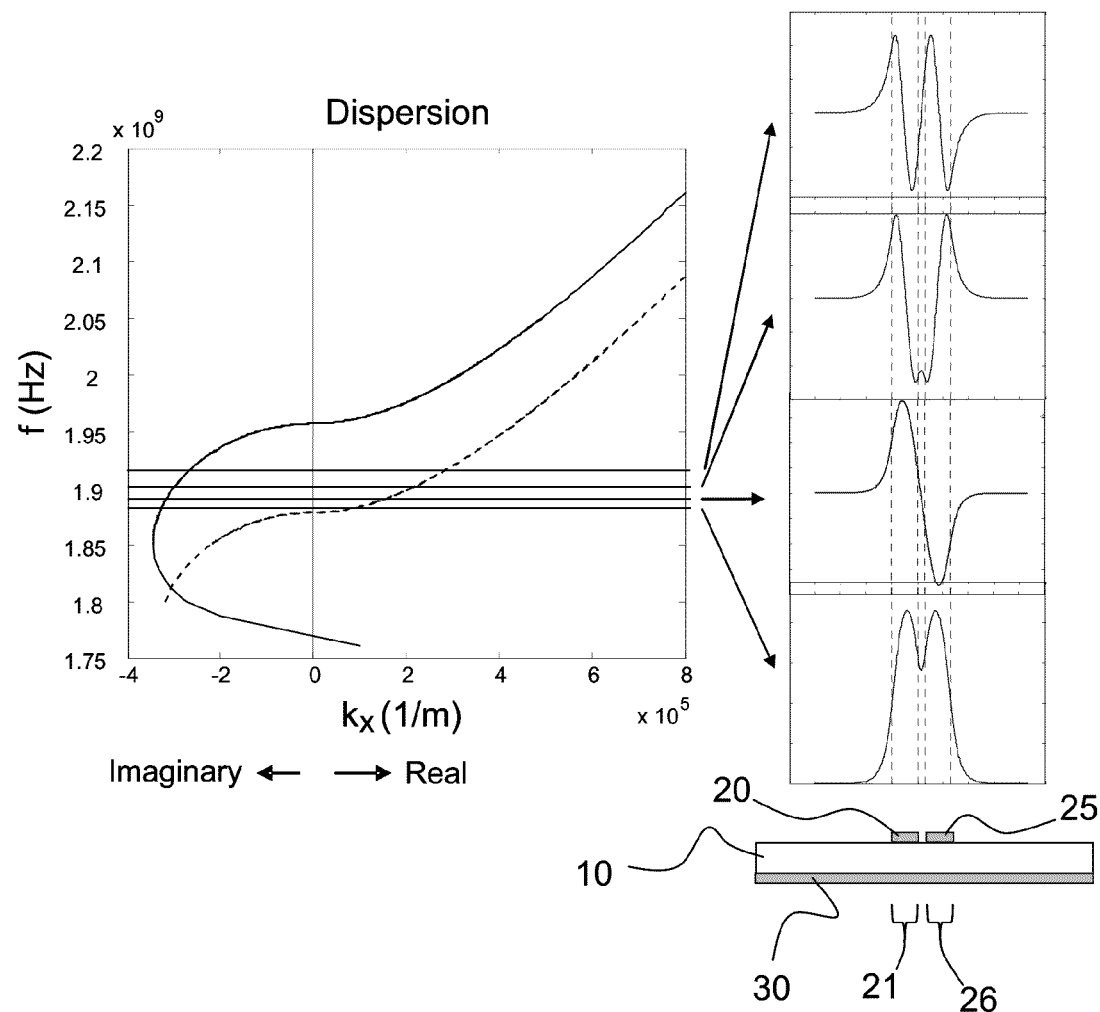
FIG. 4 shows an example dispersion characteristic for a two-resonator system, together with corresponding mode-shapes.

For a two-resonator case, the mode shapes of the four lowest eigenmodes are shown in FIG. 4.

In the foregoing description, the natural modes of vibration of isolated and coupled resonators, in the absence of external forces, were discussed. Now, the behaviour under external excitation will be considered. The mechanical response of the system under an external force can be described in terms of the eigenmodes derived above: the total vibration (that is, displacement) is a weighted sum of eigenmodes. The weight function for a particular eigenmode is a function of two main factors. The first is the difference between the input or excitation frequency and the eigenfrequency of the eigenmode. The weight function is maximal when these frequencies are identical.

The second factor is the similarity between the x-dependence of the excitation force and the x-dependence of particle vibration amplitude for the given eigenmode: the weight function is proportional to the product of F(x) and $u_3(x)$, integrated over the electrode area. Here; F(x) is the excitation force and $u_3(x)$ the particle displacement for the eigenmode, both as a function of x. For example, if the excitation is uniform in x, and the eigenmodes are sinusoidal with odd and even dependence on x, then only the even modes are excited, because the product of F(x) with $u_3(x)$ for odd modes gives a zero integral. This applies to a stand-alone BAW resonator: the electric field (serving as the force F(x)) is uniform over the electrode area; therefore, only even modes are excited in response to an applied voltage.

In a coupled system, on the other hand, only the first resonator is excited and the second electrode reacts. Depending on the excitation frequency (compared to a nearby even or odd mode eigenfrequency) the system may exhibit either an even or an odd response. If the excitation frequency is equal to an even mode eigenfrequency, then the particle vibration in the second electrode is the same as the first electrode; in a pure odd mode response, the particle vibration has the same amplitude, but opposite sign (polarity). Not only are the amplitudes of particle vibration the same for both resonators, but also the amplitudes of voltage and current at the electrodes. In effect, at these frequencies, there is complete electrical signal transfer. From the perspective of filter-design, the eigenmodes which provide complete electrical signal transfer form the pass-band.

For frequencies distant from the eigenmode of the coupled resonator system, the even and odd eigenmodes are very weakly excited, and there is very little signal transfer. From the filter-design perspective, this translates to the desired out-of-band signal suppression.

Figure 5:
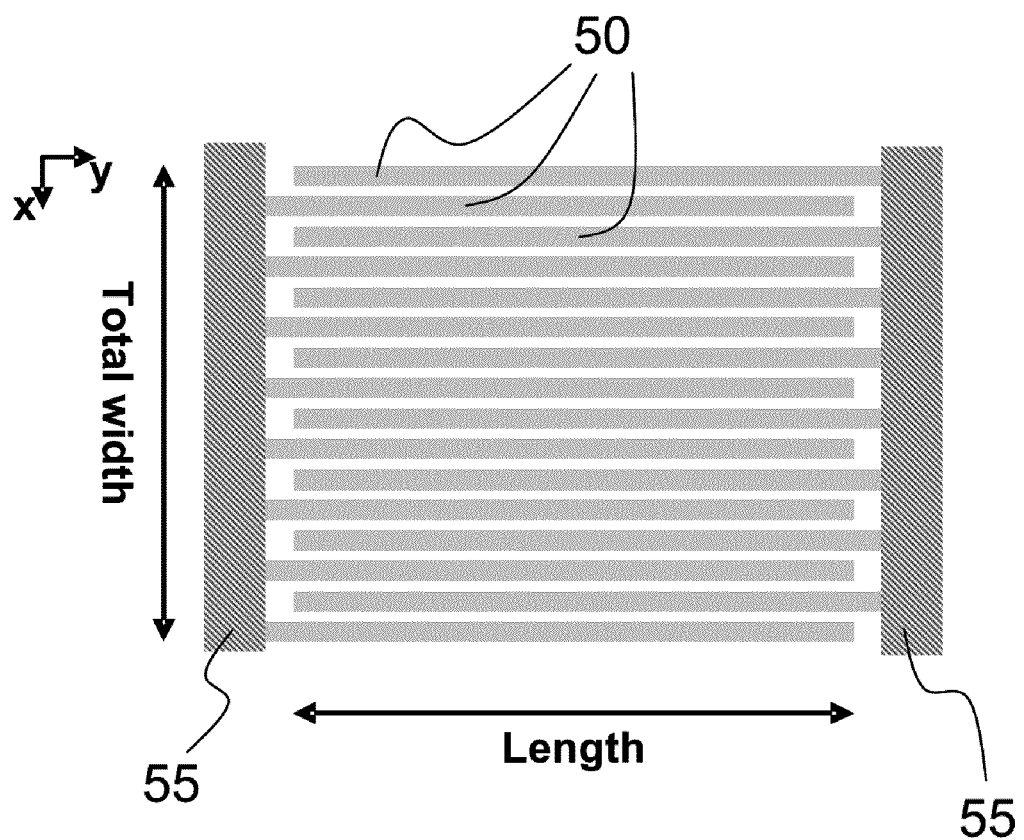
FIG. 5 is a plan view of a two-resonator LBAW device with an interdigitated finger layout.

In the foregoing description, the behaviour of the resonators was modelled in a two-dimensional plane x-z. However, for a more complete understanding, it is necessary to consider the behaviour in three dimensions. This is especially relevant for coupled resonators with an interdigitated layout, as shown in FIG. 5. In the device illustrated in FIG. 5, each electrode comprises a plurality of fingers 50, of uniform width, connected to a busbar 55.

In the context of interdigitated electrodes, the two-dimensional modelling described above can be applied on a cross-section perpendicular to the finger length direction (that is, the xz-plane, with x as indicated in FIG. 5 and z into the plane). It is often silently assumed that the wave function, representing acoustic and electrical behaviour, is uniform along the length direction. However, for conventional BAW resonators of rectangular shape, it is known that the eigenmodes have a sinusoidal dependence in both the x- and y-directions:

$$u_{3,three-dim.Conv}(x, y, z) = u_{3,0}(z)\sin\left(\frac{m\pi}{L_x}x\right)\sin\left(\frac{n\pi}{L_y}y\right)$$

Here $L_x$ and $L_y$ are the edge lengths in the x and y direction, respectively, and m and n are integers. (m,n) is called the mode index. If Ly>>Lx, then the modes (m,1) dominate the electrical device performance. For such conventional resonators, the fundamental mode (1,1) is the desired mode and the influence of the other modes (m,n) should be suppressed. For LBAWs, the three-dimensional eigenmodes can be expected to have the following shape $$u_{3,thee-dim.LBAW}(x, y, z) = u_3(x, z)\sin\left(\frac{n\pi}{L_y}y\right)$$

with $u_3(x,z)$ as defined previously.

The current inventors have recognised that an LBAW device should be designed to trap at least two eigenmodes. In this regard, the laterally-coupled device contrasts with a conventional BAW device: for a conventional BAW device, trapping of one eigenmode is sufficient.

The reason for trapping a plurality of modes is to provide increased bandwidth: if an eigenmode is trapped and is effectively excited by an electrical signal on the input electrodes then, for excitation around the corresponding eigenfrequency, the system will vibrate according to the mode-shape of the eigenmode. If the output electrode also has effective coupling to this eigenmode, then the mode will attract charge. As a result, electrical signal transfer from the input to the output electrodes is possible for the full range of desired frequencies.

Figure 6:
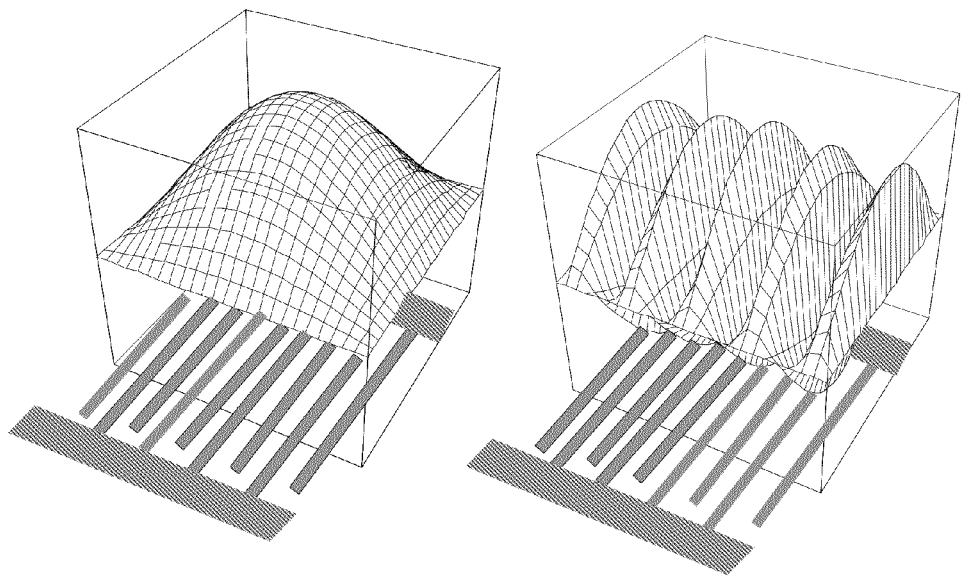
FIG. 6 shows the fundamental even and odd eigenmodes for an interdigitated device of the type shown in FIG. 5.
Figure 7:
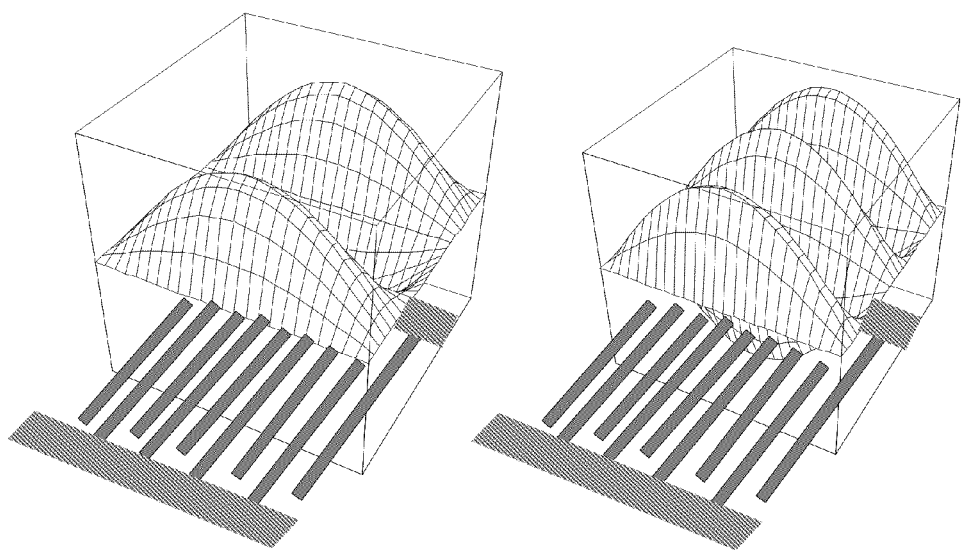
FIG. 7 shows higher eigenmodes, for the same device, which have a higher wave number in the length direction of the fingers.

The modes that should be excited in the LBAW are the fundamental even mode and odd mode. The fundamental even mode is the (1,1)-mode: the wave function has one half sine in the width direction and one half sine in the length direction of the fingers. This mode is illustrated in the left-hand plot of FIG. 6. The fundamental odd mode for an M-finger device is the (M,1)-mode, with M half sines in the width direction and one in the length direction. This mode is illustrated in the right-hand plot in FIG. 6. The device of FIG. 6 is a nine-fingered coupled resonator; therefore, the fundamental odd mode is the (9,1)-mode. Overmodes are modes (m,n) with either m>M (overmodes in the width direction) or n>1 (overmodes in the length direction). The latter category, in particular, should not be excited as they will appear as peaks in the transmission curve of an LBAW filter. Overmodes in the length-direction for the nine-fingered device of FIG. 6 are shown in FIG. 7.

As is clear from the foregoing description, the successful implementation of filtering functionality using LBAW devices depends on careful selection of the eigenmodes which can be excited by an input signal. In the following description, a design methodology for correct trapping of eigenmodes will be discussed. In particular, the current inventors have recognised that careful design of the properties of the external region can be used to more accurately control the modes trapped.

According to an embodiment of the current invention, the external region is designed such that its cut-off frequency is just above the eigenfrequency of the highest eigenmode to be trapped. This ensures that exactly the desired modes are trapped. For LBAWs this provides a direct way of trapping the energy.

Figure 8:
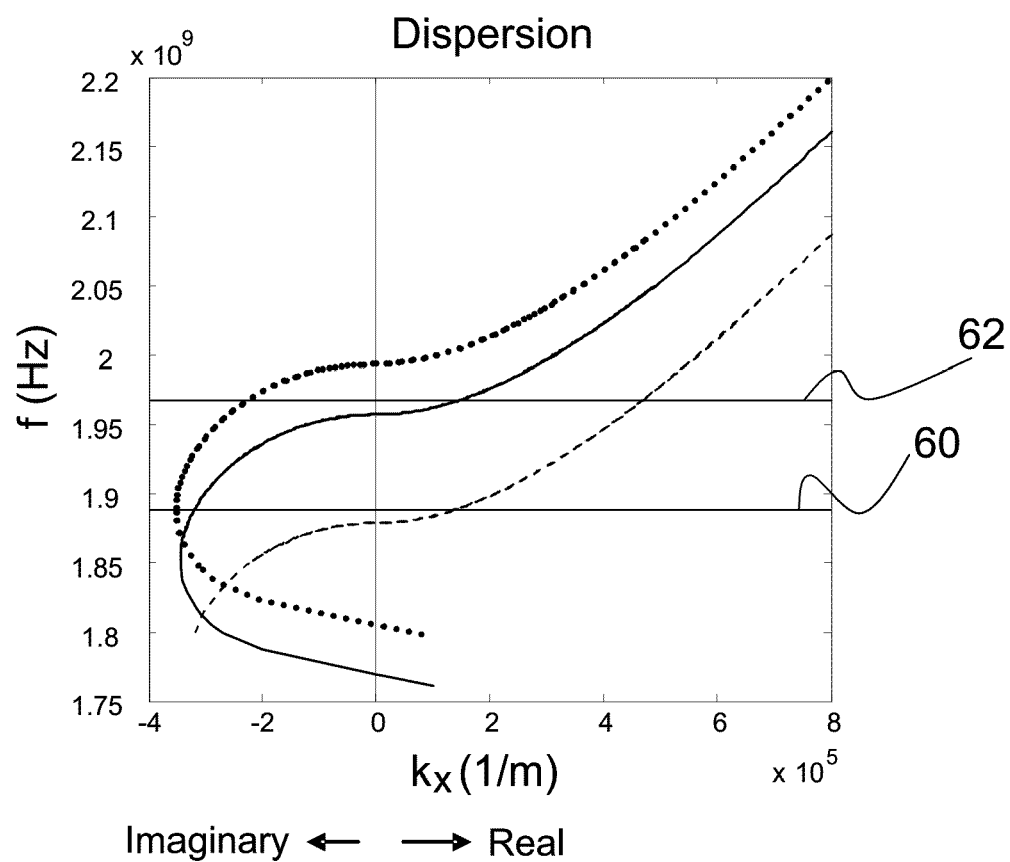
FIG. 8 illustrates the design of dispersion characteristics according to an embodiment of a first aspect of the invention, so as to trap two desired eigenmodes.

An example of this kind of energy trapping is shown in FIG. 8. The dispersion curve of the electrode region is shown by the dashed line. The eigenfrequencies of the fundamental even mode 60 and fundamental odd mode 62 are also shown, by horizontal lines on the graph. A sub-optimal dispersion curve for the external and gap regions is shown by the solid curve. This characteristic curve has a cut-off frequency that traps the even mode 60 but is too low to trap the odd mode 62. This will not give a good pass-band response—typically, the pass-band at the high-frequency side will show undesirably high insertion loss. The dotted curve shows another dispersion curve for the external region. This curve has been optimised by careful design of the layer stack, such that the cut-off frequency has been shifted upward by approximately 50 MHz. Now both the fundamental even and odd eigenmodes are trapped.

Figure 9:
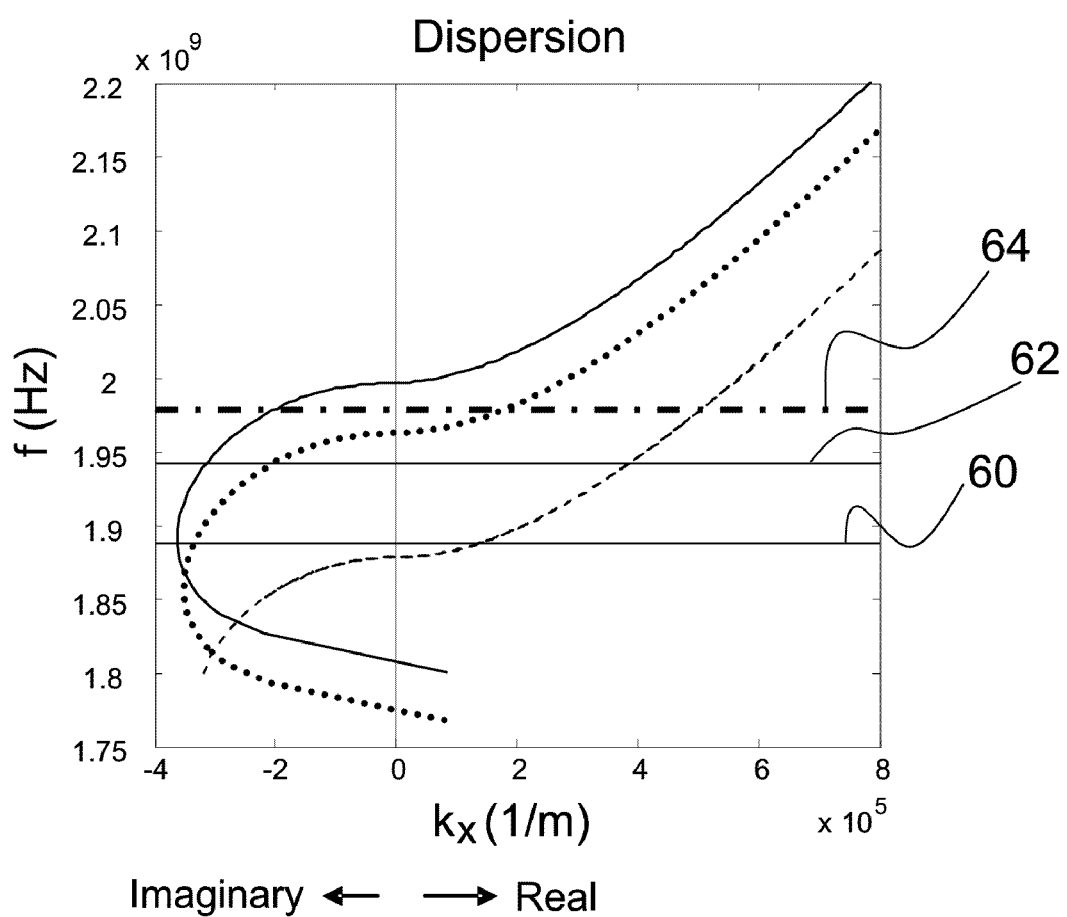
FIG. 9 illustrates the design of dispersion characteristics according to an embodiment of the first aspect, so as to suppress an undesired overmode.

A similar approach can be used to control overmodes. FIG. 9 shows another set of example dispersion curves. Here the first (m,3)-mode, or overmode 64, is also shown. The sub-optimal curve (solid curve) for the external region has a cut-off frequency too high to reject this overmode. Trapping of overmodes typically gives rise to unwanted peaks in the frequency response, outside the pass-band. However, by optimisation of the layer stack in the external/gap regions, the dispersion can be adjusted to lower the cut-off frequency (as shown by the dotted curve). This latter curve provides trapping for the desired fundamental (both odd and even) eigenmodes, but suppresses the overmode 64.

To explain this approach in another way: the analysis, previously described above, has shown that for an eigenmode to be viable, the conditions for sinusoidal variation in the electrode region and exponential decay in the external region must be met. By modifying the construction (that is, layer stack) of the external region, the set of eigenmodes which can satisfy the exponential decay requirement is changed. This provides precise control of the trapped eigenmodes and thus precise control of the frequency characteristics of the coupled resonator system.

As discussed above, it is desirable to trap the fundamental odd and even eigenmodes, but reject all overmodes. Unfortunately, in some designs, this will not be possible, since the lowest overmode may have an eigenfrequency which is lower than that of the fundamental odd mode. That is, the desired modes and overmodes overlap, such that it is impossible to fully discriminate between them by selection of the cut-off frequency. It is nonetheless possible to predict (to a first approximation) the designs for which separation of the fundamental modes and overmodes is possible. This will be described in the following.

The desired fundamental odd mode in an M-finger device is the (M,1) mode. A lower limit for the wavelength associated with this fundamental odd mode, can be obtained by assuming the finger width $w_{finger}$ to be equal to half of the lateral wavelength $\lambda$. In this case, assuming M>>1, the wave number is:

$$k_{odd\ max} = k_{(M,1)} = \frac{2\pi}{\lambda} = \frac{2\pi}{2w_{finger}} = \frac{\pi}{w_{finger}}$$

The lowest overmode in the length direction is the (1,3)-mode. The associated wave number can be approximated as:

$$k_{(1,3)} = \pi \sqrt{\left(\frac{1}{width\_total}\right)^2 + \left(\frac{3}{L}\right)^2}$$

Here, width_total is the overall width of the LBAW device and L is the length of the fingers. For the dispersion curves considered above, the dispersion curve has a positive slope around the cut-off frequency. Therefore, the condition for separation of the fundamental modes and overmodes is $f_{eigen(1,3)} > f_{eigen(M,1)}$; or equivalently, $k_{(1,3)} > k_{(M,1)}$. So separation is possible if:

$$\frac{1}{width\_total^2} + \frac{9}{L^2} > \frac{1}{w_{finger}^2}$$

For a practical case, in which width_total L, the first left-hand term will be dominated by the second term and the condition is thus:

$$L < 3w_{finger}$$

This condition may or may not pose a limiting factor in practice, depending on other design considerations.

As described above, according to an embodiment of the invention, the dispersion of electrode region and external region are made different, in order to adapt the dispersion characteristics of the device. In particular the cut-off frequencies, $f_{cutoff.electr}$ and $f_{cutoff.ext}$, are controlled independently. This means that the layer stacks for the two regions are different. Traditional ways of reducing the cut-off frequency of a given layer stack include: increasing the thickness of one or more layers; adding a layer (typically on top of the layer stack); or replacing one layer with another layer having a larger mass density or smaller acoustic wave velocity. Clearly, cut-off frequency can be increased by adopting the opposite strategies.

In this way, the principles for adjusting the cut-off frequency are similar to those for conventional BAW devices. Such principles will be well-known to the skilled person.

For example, when adding an additional layer, or increasing the thickness of an existing layer, the layer concerned may be on the top of the layer stack or deeper inside it. If the layer is at the top surface, its influence scales with the mass per unit area: that is, with $\rho t$, where $\rho$ is the mass density of the material and t is the layer thickness. Deeper in the layer stack, prediction of the effects is generally not this straightforward. Note that if the layer stack includes an acoustic reflector, then modification of layers within the reflector may be relatively ineffective: that is, the shift in cut-off frequency per nanometre of material is small.

In any case, given a desired shift in dispersion, the proper layer thickness can be derived from trial and error simulation. For this purpose, a simple one-dimensional simulation suffices. The principles of such a simulation have been described in, for example, J. Rosenbaum, "Bulk Acoustic Wave Theory and Devices" (Artech House, Boston, Mass., 1988) and are well-known.

One important but implicit difference between the layer stacks for external and electrode regions is that the latter has a bottom and top electrode. In the external region at least one of the electrode layers is missing, automatically making $f_{cutoff.ext}$ larger than $f_{cutoff.electr}$. Thus, one approach to implementing the current invention is to carefully select the electrode layer material and its thickness, such that the cut-off frequency $f_{cutoff.ext}$ is just above the odd mode eigenfrequency of the system (for example, 2% above the eigenfrequency). In other words, the layer stack in the external region is designed to have the desired cut-off frequency. This layer stack is also shared by the electrode region; however, the cut-off frequency in this latter region can also be controlled by varying the thickness of the electrodes. This thickness can be chosen to provide the desired offset in cut-off frequencies between the electrode region and the external region. In this way, the electrode thickness in the electrode region can be said to indirectly provide the desired cut-off frequency in the external region.

In practice, an iterative design process may be employed. For example, the design of the layer stack for the electrode and external regions may be done as follows: a layer stack for the electrode region, consisting of at least a pair of electrodes and a piezoelectric layer, but usually also other layers (such as a reflector layer), is designed for good one-dimensional performance (proper cut-off frequency, negligible acoustic loss to the substrate, sufficient electromechanical coupling). Then, the properties—in particular the cut-off frequency—of the corresponding layer stack for the external region are investigated. Apart from the missing top electrode, this external region has the same stack as the electrode region. If the cut-off frequency is not within the desired range from the cut-off frequency of the electrode region (for example it is too high), the top electrode thickness is altered (thinned) and in order to maintain the same cut-off frequency for the electrode region, the thickness of one or more other layers is adapted (increased). In this new case, the adapted (thickened) other layer is shared by both the electrode and external regions. Therefore, the net effect is that the cut-off frequency of the external region is changed (lowered), while the cut-off frequency of the electrode region stays the same. This is a trial-and-error procedure that can be carried out with a conventional one-dimensional model.

There may be some circumstances in which control of the electrode material and thickness is insufficient to tune dispersion characteristics to the desired extent. For example, this design approach may lead to very thin electrodes, such that increased electrical resistance becomes a limiting factor in filter performance. Therefore, an alternative (or supplement) to this approach may be required. In another approach to implementation, electrodes are used that are thicker than would be suggested by the first method, but $f_{cutoff,ext}$ is decreased, by adding a non-conducting layer to the external region.

Replacement of a given layer with a different material is also a technique well known to those skilled in the art. When this is done in the uppermost layer, the mass density is again the critical parameter. By way of example, a top electrode made of aluminium might be replaced by a layer of silicon dioxide in the external and/or gap regions. This approach is often more practical, as the freedom of the designer is not as restricted with regard to the thickness of the top electrode.

Note that the invention is not limited to these example approaches: as will be apparent to the skilled person, any other method for controlling the dispersion of the electrode and/or external regions can also be used.

Figure 10:
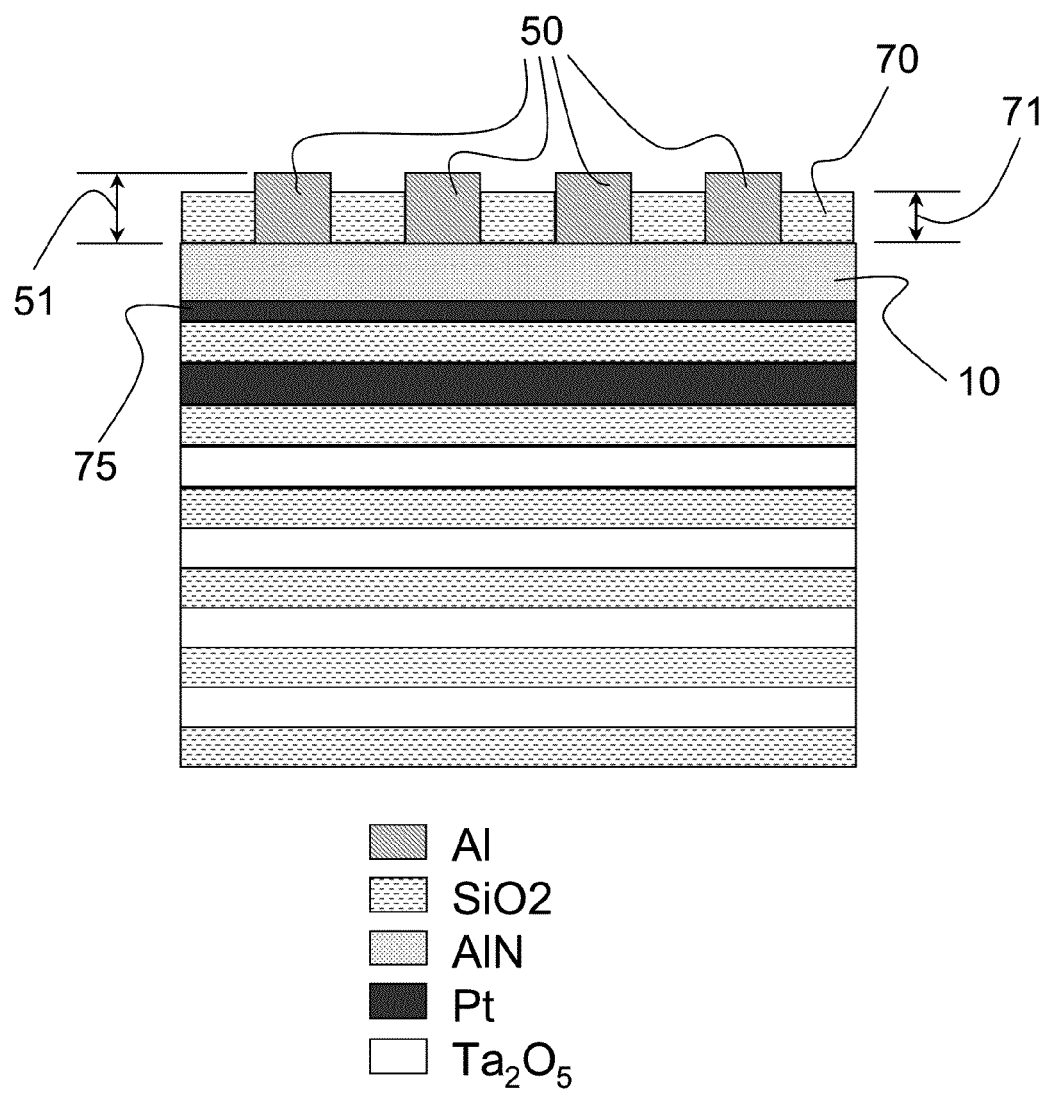
FIG. 10 shows an example layer structure for a device according to an embodiment.
Figure 11:
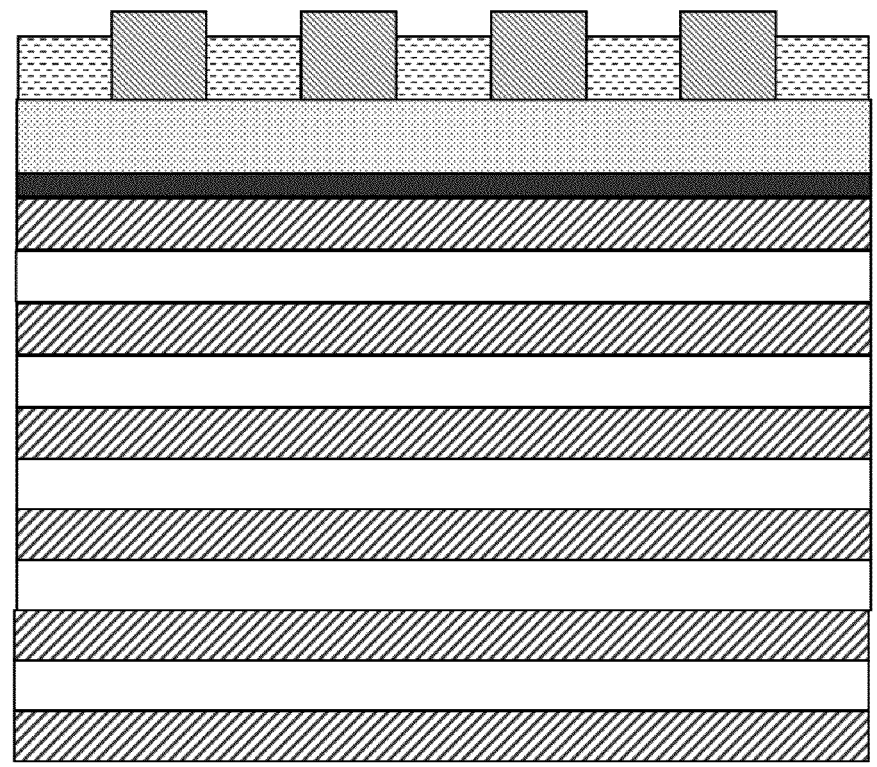
FIG. 11 shows a second, alternative layer structure.

FIG. 10 shows an example according to an embodiment, combining several techniques to control dispersion (in particular, cut-off frequency). The device comprises a piezoelectric layer 10 formed of aluminium nitride and a bottom electrode 75 of platinum, beneath which lies a plurality of layers of silicon dioxide and tantalum pentoxide. The interdigitated top electrodes 50 are made of aluminium. In the gaps between the Al electrodes, $SiO_2$ is deposited in layer 70. In this device, the layer stack of the gap and is identical to that of the external region. The thicknesses of the Al top electrode 50 and the $SiO_2$ gap-filler 70 are chosen such that the difference in cut-off frequencies is approximately 100 MHz. In this example, the layer thickness 51 of the Al electrode is 455 nm, while the thickness 71 of the silicon dioxide us 400 nm. As will be apparent to one skilled in the art, these value may be significantly different for other stack designs. FIG. 11 shows another, more general example of a layer stack design according to an embodiment.

Note that the foregoing description has considered resonator devices in which the layer stack exhibits so-called "Type-I" dispersion. Type-I dispersion curves have a positive slope for wave numbers about the cut-off frequency. However, other layer stacks exhibit "Type-II" dispersion, in which the dispersion curves have negative slope in the vicinity of the cut-off frequency. The invention is equally applicable to devices of this type. For Type-II dispersion, the basic condition is the same: that the wave number is imaginary-valued in the external region and real-valued in the electrode-region, for the eigenfrequencies to be trapped. However, due to the negative slope of the curve, this translates to a requirement that the cut-off frequency of the electrode region is above the desired eigenfrequencies while the cut-off frequency of the external region is below them.

Different approaches may be necessary for implementation of the invention in Type-II devices, as distinct from Type-I. For example, the external region may contain an extra layer, compared with the electrode region; one or more layers may be thicker in the external region than in the electrode region; or one or more layers in the external region have a higher mass density or smaller wave velocity than in the electrode region.

The implementation of layer stacks according to the principles of the invention can be achieved using known design tools. For example, the dispersion curves for a layer stack can be predicted from appropriate simulations, in one or two dimensions. Alternatively, the characteristics can be determined experimentally, for example by means of laser interferometry.

Although example LBAW devices according to embodiments of the first aspect of the invention have been described, it will be readily apparent to the skilled person that these examples do not imply limitations to the scope of application of the invention. For example, although interdigitated resonator structures have been described which have uniform finger-width, the invention is equally applicable to cases in which the widths of different fingers vary or the width of a given finger varies along its length. Similarly, the layer stacks of the gap (the portion between the electrodes) and the external or remaining portion (surrounding the electrodes and gap) may be the same or different.

The second aspect of the invention will now be described.

The current inventors have also recognised that the eigenmodes trapped and their mode-shapes can be influenced through independent control of the dispersion characteristics in the external portion as compared to the gap portion. Both these regions lack at least one of the two electrode layers; however, the current inventors have recognised that the layer stacks of the two regions can be made different, such that they no longer share the same dispersion characteristics.

This new degree of freedom can be exploited to design for a greater frequency difference between the first two fundamental eigenmodes, which has the effect of increasing the pass-band bandwidth of the filter transfer function.

Furthermore, is possible to design for real wave numbers in the gap regions, while the external region still presents an imaginary wave number at the eigenfrequencies of the eigenmodes of interest. Providing a real wave number in the gap region may also be helpful in realizing balun functionality. The benefits of providing an imaginary wave number in the external region have been discussed above in the context of the first aspect of the invention.

By choosing the cut-off frequencies of electrodes and gap to be identical (or nearly identical), the variation in the vertical mode-shape across the coupled resonators is minimized.

Figure 12:
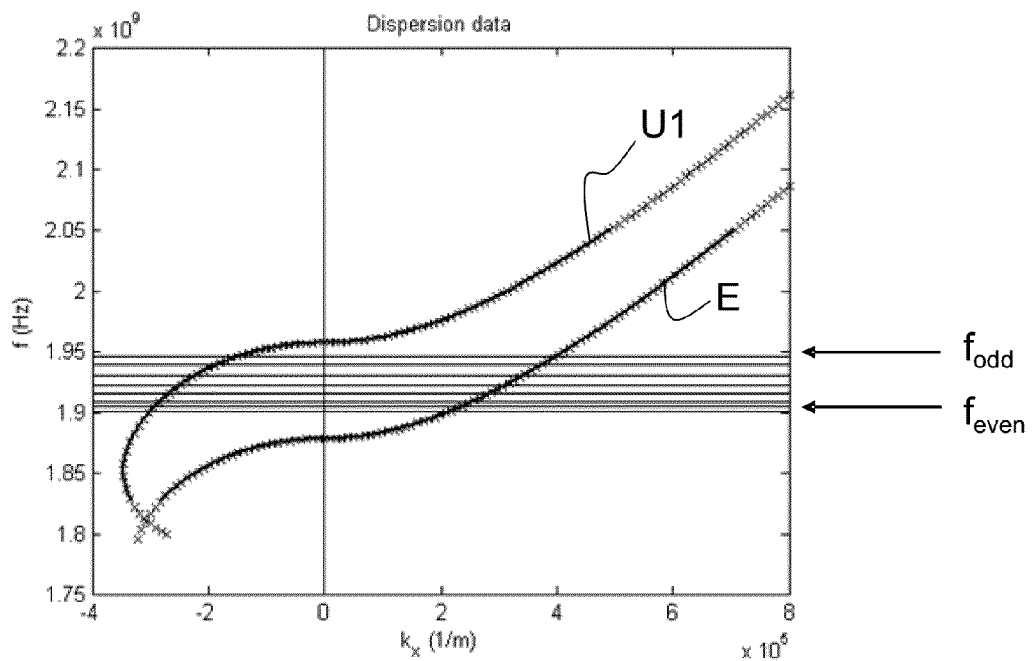
FIG. 12 shows simulated dispersion curves for an embodiment of the first aspect.

Examples of this aspect of the invention will now be described with reference to FIGS. 12-16. FIG. 12 shows a set of simulated dispersion curves for a device not having the features of this aspect of the invention. In other words, the dispersion curves of FIG. 12 relate to a LBAW device in which the electrode region has dispersion characteristic E and the gap region and remaining (external) region has dispersion characteristic U1. The eigenfrequencies of the trapped eigenmodes are indicated by the solid horizontal lines. The lowest eigenfrequency (1901 MHz) corresponds to the fundamental even mode and the highest trapped eigenfrequency (1945 MHz) corresponds to the fundamental odd eigenmode.

Figure 13:
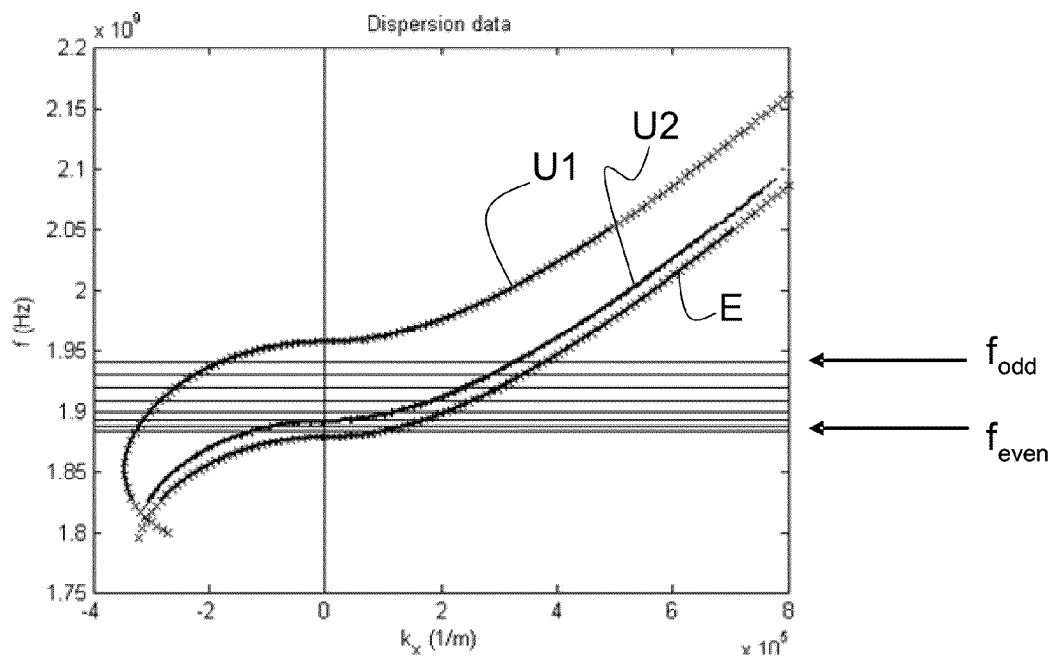
FIG. 13 shows simulated dispersion curves for an embodiment of a second aspect of the invention.

FIG. 13 shows a similar set of simulated dispersion curves, for a device according to an embodiment of the second aspect of the invention. That is, the electrode regions have dispersion characteristic E; the external (remaining) portion has dispersion U1; while the gap region between the electrodes has dispersion U2. The frequency difference between the corresponding highest (1940 MHz) and lowest (1884 MHz) trapped eigenmodes has been increased by approximately 25%. This means that the bandwidth provided by the filter is correspondingly increased. Note that the dispersion characteristics of the gap and the electrodes are nearly the same. Therefore, eigenmodes can be expected to exhibit a sinusoidal wave function in the gaps. At the same time, the dispersion of the remaining portion is preserved, so that this region presents an imaginary wave number. Thus, the eigenmode still exhibits an exponential wave function in this region, ensuring correct trapping.

Preferably, the cutoff frequency of the gap portion has a cutoff frequency within 2% of the corresponding cutoff frequency of the electrode portion.

The techniques that may be used to achieve the desired dispersion characteristics are similar to those discussed above in the context of the first aspect of the invention.

The dispersions of gap and external region must be made different. This means that the layer stacks for these two regions are different. Taking the layer stack of the remaining portion starting point, the task is to provide a gap region with lower cut-off frequency (assuming the device exhibits Type-I dispersion, as is the case for FIGS. 12 and 13).

Ways of reducing the cut-off frequency of the layer stack include: increasing the thickness of one or more layers; or adding an extra layer, usually on top of the layer stack. For the non-electrode gap portion, any extra layer should preferably be of insulating material. In theory, it may be possible to use a metal, provided this is isolated from the electrodes; however, this would present practical problems, such as capacitive cross-talk with the electrodes.

The restriction that the extra layer is not a metal could be a substantial limitation for a conventional BAW device. In such devices, the layer stack design of the electrode region typically results in a relatively thick top electrode layer (for example, 100 nm or more) with a high mass density (tungsten and platinum are commonly favoured materials). In many cases, impractically thick dielectrics would be required in order to bring the cut-off frequency for the gaps to a similar value as for the electrodes.

However, for LBAWs it is possible to avoid such thick and heavy electrodes. In one embodiment of the second aspect of the invention, a light metal (such as aluminium) is used for the top electrodes. The thickness of this electrode layer can be dictated by criteria other than acoustics—for example, the thickness can be chosen to provide a sufficiently low electrical resistance. The gaps between the electrodes can be filled (partially or completely) with a dielectric with mass density and thickness such that the cut-off frequencies of the gap region and the electrode region have the desired (small) frequency difference, as in FIG. 13. With a light metal such as aluminium, matching of cut-off frequencies can be achieved with reasonable thickness values of the dielectric material filling materials in the gap. There are no severe requirements for the dielectric material, apart from the fact that its intrinsic acoustic quality factor should be well above 1500: silicon dioxide, silicon nitride, and aluminium nitride all meet this requirement. It is preferable that the acoustic properties of the dielectric material are similar to those of the top electrode layer. This allows the design to use the same thickness of material in both regions, which can make the device easier to manufacture (see below).

Figure 14:
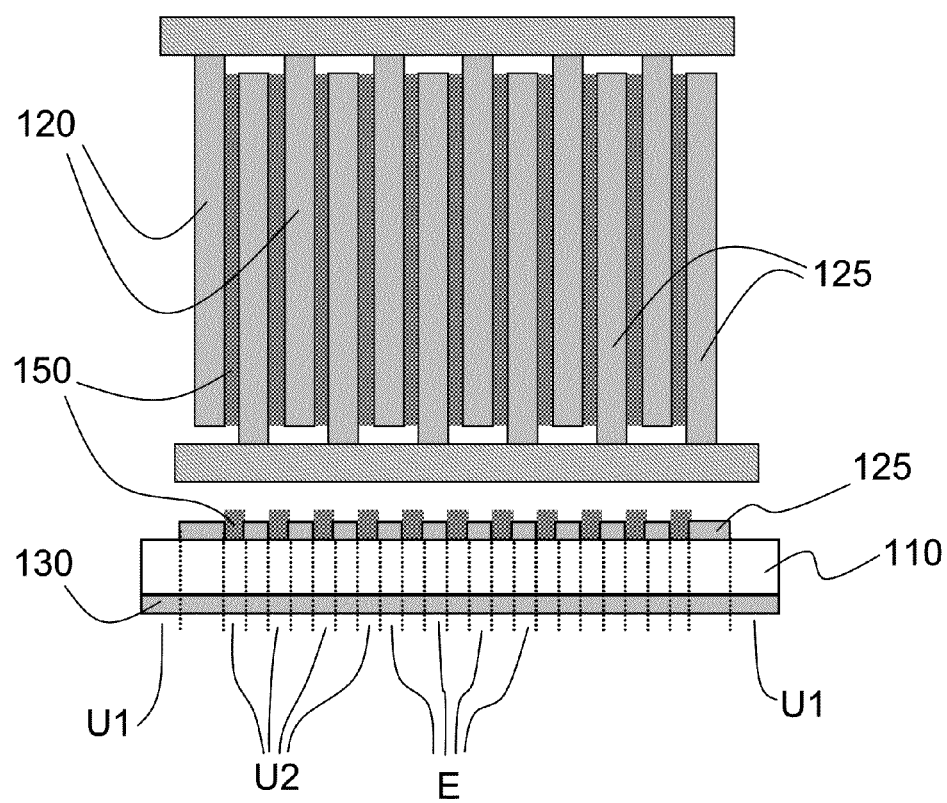
FIG. 14 illustrates an exemplary layout and layer structure for an embodiment like that of FIG. 13.

An example of a LBAW device according to such an embodiment is shown in FIG. 14. In this device, the first 120 and second 125 top electrodes have an interdigitated pattern. The top electrodes are laid on a layer of piezoelectric material 110, beneath which lies the bottom electrode 130. The gap between the first and second top electrodes is filled with a non-conducting material 150. The thickness of this is chosen to match the dispersion characteristic U2 of the gap region to the characteristic E of the electrode region. The external region has dispersion U1.

Figure 15:
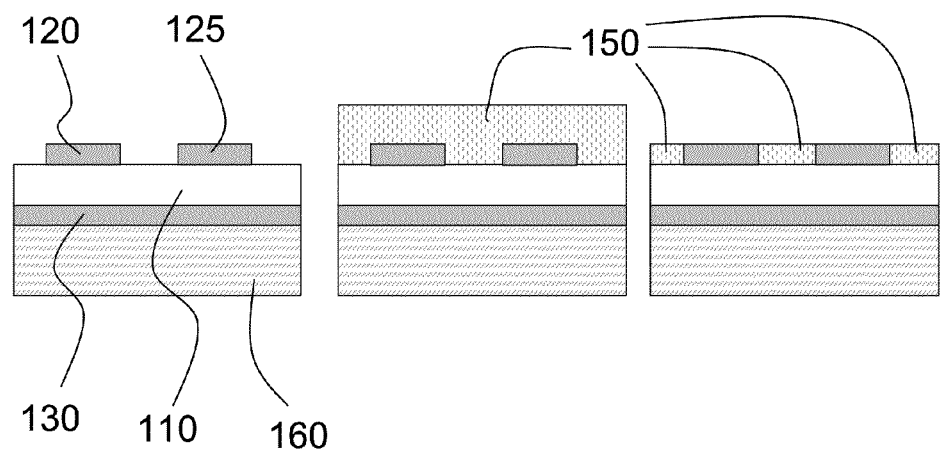
FIG. 15 illustrates steps in a manufacturing process suitable for producing a layer structure like that of FIG. 14.
Figure 16:
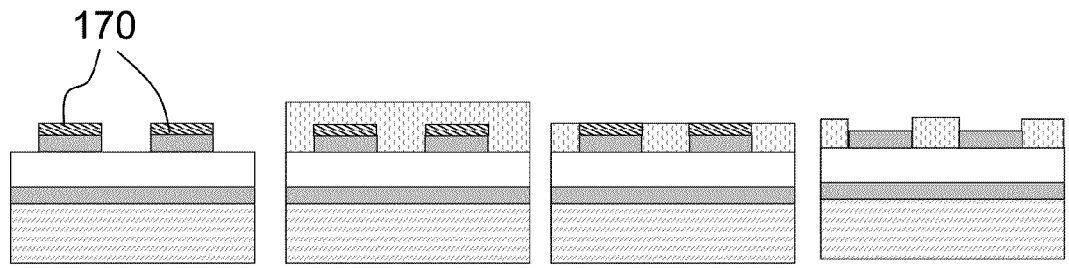
FIG. 16 illustrates a related, alternative process.

Chemical-Mechanical Polishing (CMP) may be beneficially employed to accurately control the thickness of the gap material. Accurate control is important since this thickness controls the frequency difference between the cut-off frequencies of the electrode and non-electrode regions. FIGS. 15 and 16 show examples of fabrication processes involving CMP.

As shown in the left-hand diagram of FIG. 15, top electrodes 120 and 125 are fabricated on top of the piezoelectric layer 110, beneath which lies the bottom electrode 130. In this example, the bottom electrode is located above a reflector layer 160. A layer of dielectric material 150 is deposited over the top electrodes 120 and 125 and exposed (non-electrode) portions of the piezoelectric layer 110. This step is shown in the middle diagram of FIG. 15. CMP is then performed, resulting in the layer structure shown in the right-hand diagram. In this case the dielectric in the gap region is intended to have the same thickness as the electrodes; therefore the top electrode material could conveniently serve as a CMP-stop detector. However, even slight over etching of the electrodes (and the dielectric) will change the dispersion characteristics of the device. Furthermore, because the acoustic impedance of the electrode material and dielectric material will generally be different, the cutoff frequency of each region will change by a different amount. Therefore, it may be desirable to provide an additional stop-layer, which may in general be a sacrificial layer.

FIG. 16 shows a further example of a suitable set of processing steps. In this case, an additional sacrificial layer 170 is provided on top of the top electrodes 120 and 125. All other layers are as shown in FIG. 15. In this case, the sacrificial layer is used for etch-stop detection, therefore CMP stops when the top of this layer is exposed. Finally, the sacrificial layer is removed in a selective etch step, as shown in the far right-hand diagram of FIG. 16. In this way, the use of a sacrificial layer allows accurate control of the thickness of the dielectric in the gap region, even when the design calls for a thickness greater than that of the top electrodes. This allows greater flexibility and design freedom in the choice of materials and thicknesses.

As will be readily apparent to one skilled in the art, although the examples given above relate to Type-I devices, the second aspect of the invention is equally applicable to the design of LBAW devices having Type-II dispersion. In this case, of course, the conditions to be satisfied by the various cut-off frequencies will be reversed. For example: in the Type-I embodiment described above, it was noted that the cut-off frequency in the gap portion is reduced, compared to the cut-off frequency in the remaining portion. In an equivalent Type-II embodiment, the gap should have a higher cut-off frequency than the external region.

Although the example given in FIG. 14 relates to an interdigitated design, it will be equally clear to the skilled person that the second aspect of the invention is no less applicable to other electrode layouts.

The third aspect of the invention will now be described.

The current inventors have also recognised that the eigenmodes trapped and their mode-shapes and eigenfrequencies can be influenced by the careful design of electrode regions having spatially varying dispersion characteristics. More specifically: one (or more) of the electrode portions of the LBAW device can have a non-uniform layer structure. By way of example, we will consider two beneficial arrangements, which can be employed individually or combined. Both examples will be described in the context of the interdigitated electrode layout considered previously above. However, the skilled person will understand that the benefits of this aspect are not confined to such layouts.

Figure 17:
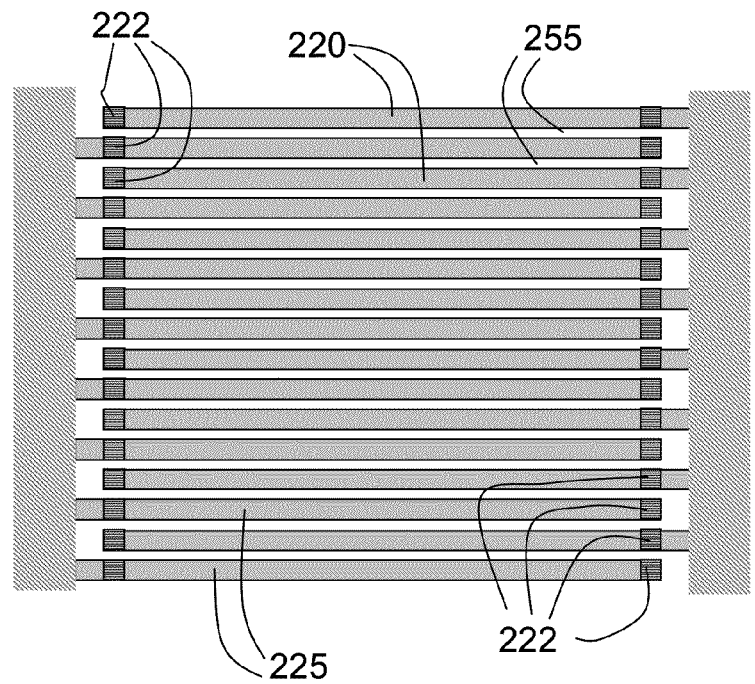
FIG. 17 shows a layout according to an embodiment of a third aspect of the invention.

In the first example, each finger of both electrode portions has a first segment at the finger-tip and a second segment, comprising the remainder of the length of the electrode, which has a different layer structure to the first segment. This is illustrated in FIG. 17. The first segment 222 at each finger tips has a dispersion characteristic with a lower cut-off frequency than the remainder of the finger (second segments 220). In the example shown in FIG. 17, the gap region 255 has the same layer structure (and therefore dispersion characteristic) as the external region surrounding the coupled resonators.

The variation in the dispersion characteristic at the finger tips has the effect of changing the shape of the eigenmodes supported by the device. In particular, the mode shape along the length direction of the fingers is changed, so that it is more uniform. Recalling FIG. 6, it can be seen that the fundamental odd and even modes obtained with a simple interdigitated layout have a sinusoidal profile (with a half-sine period) in the length direction. By providing finger ends with lower cut-off frequency (for Type-I devices), this sinusoidal mode-shape can be flattened and spread to present a more uniform profile over the length of each finger.

With this more uniform mode-shape, the coupling of the electric field to the fundamental eigenmodes is improved, because the electric field is itself uniform over the length of the finger. Accordingly, the quality factor of these modes is increased.

At the same time the suppression of unwanted higher modes can be improved. The shapes of the overmodes (m,n), where n is greater than 1, are modified so that they are sinusoids with a full wavelength over the length of the fingers. This is in contrast with FIG. 7, which shows overmodes with an odd number of half-sines. The excitation strength of the modified (full-wavelength) overmodes is very low.

Figure 18:
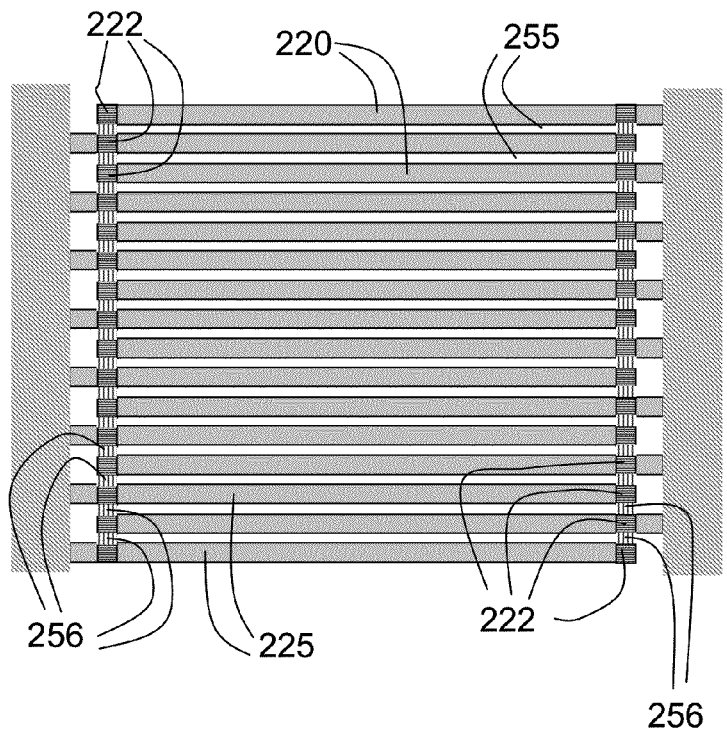
FIG. 18 shows a second exemplary layout according to the third aspect.

FIG. 18 illustrates a variation on the layout of FIG. 17. Here, both the finger tips 222 and the adjacent segments 256 of the gap 255 have adapted dispersion characteristics (that is, adapted cut-off frequencies). The cut-off frequency of the first segments (finger tips 222) of the electrode portions is lower than that of the second segment (remainder 220). Similarly, the cut-off frequency of the first segments of the gap (gap-ends 256) is lower than that of the remainder of the gap 255. The cut-off frequencies of the electrode finger tips 222 and the gap-ends 256 may be the same.

Figure 19:
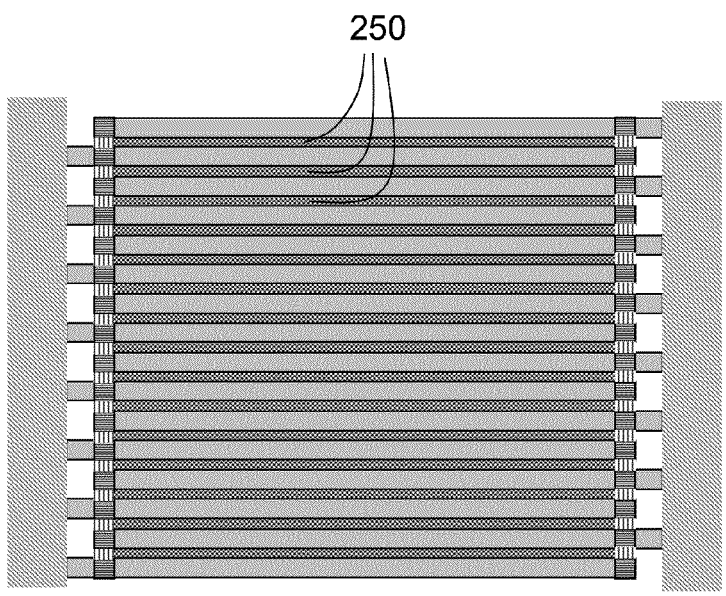
FIG. 19 shows a third exemplary layout according to the third aspect

FIG. 19 shows another variation. Compared with the example of FIG. 18, the dispersion characteristic of the gap region 250 is now modified with respect to the external region—that is, the remaining portion, surrounding the LBAW device. Therefore, this example combines this third aspect of the invention with the second aspect described previously above.

As can be seen from the examples of FIGS. 17-19, independent control of the dispersion characteristics in the various regions provides multiple degrees of design-freedom. These can be used to optimise the device characteristics according to the needs of specific applications.

Figure 20:
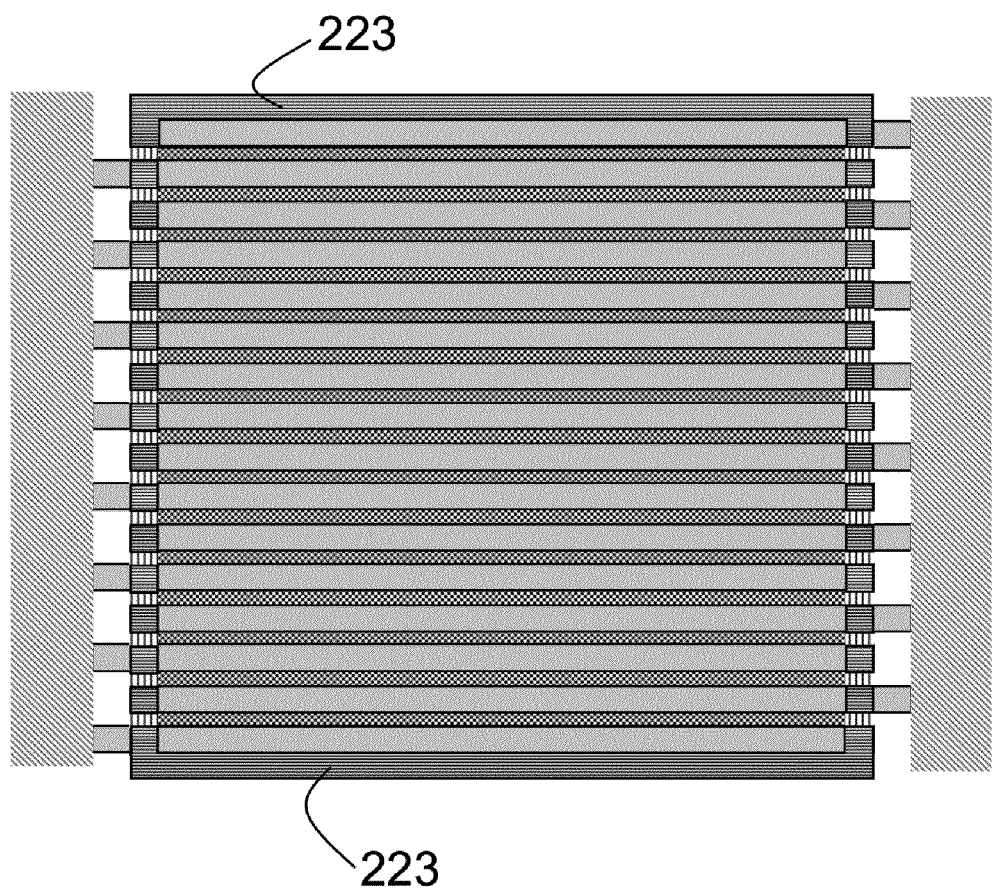
FIG. 20 shows a fourth exemplary layout according to the third aspect.

FIG. 20 presents a second example of the third aspect of the invention. This layout is similar to that of FIG. 19, but the outermost fingers in the interdigitated pattern are additionally provided with a longitudinal segment 223 which has a different dispersion characteristic to the rest of the fingers. The example of FIG. 20 includes the features described above, wherein the tips of the fingers also have modified dispersion characteristics. However, the longitudinal segments 223 on the outer fingers could also be provided independently of these other features. The longitudinal segments 223 may be partial width, or they may comprise the full width of the outermost fingers. According to the example shown in FIG. 20, the outer longitudinal segment 223 has a lower cut-off frequency than the remainder of the fingers 220. This corresponds to Type-I dispersion.

The effect of modifying the outermost fingers will now be described, with reference to FIGS. 21 and 22. Firstly, note from FIG. 6 that the profile of the fundamental even eigenmode in the direction transverse to the finger length has a sinusoidal envelope, with one half-sine width. (This can be seen from the left-hand side of FIG. 6). The modification of the dispersion characteristic at the outside edge of the outermost fingers changes this.

Figure 21:
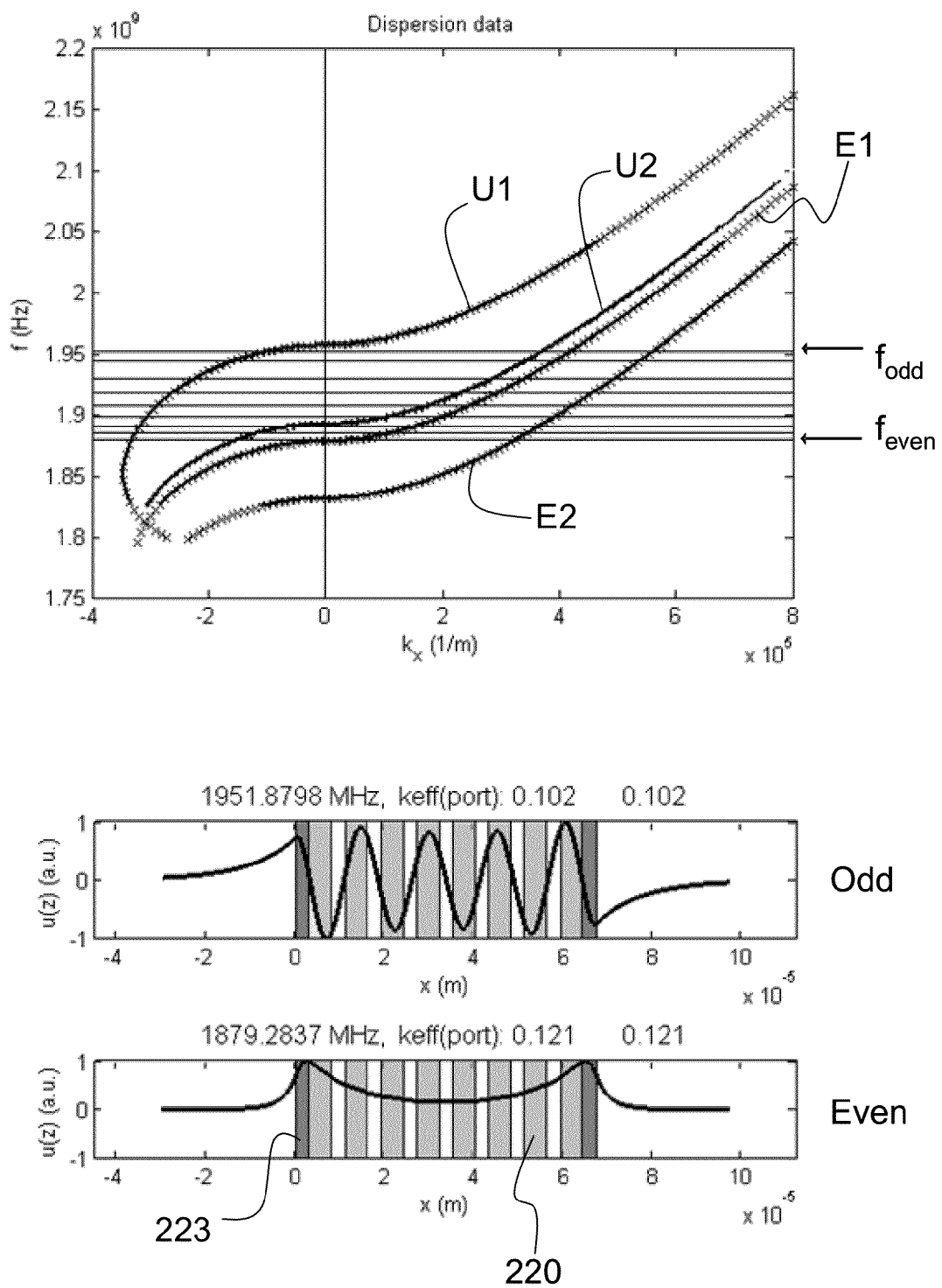
FIG. 21 shows simulated dispersion curves and mode-shapes for an embodiment according to the third aspect.

The example of FIG. 21 assumes that the outer segments 223 of the electrode portions have a dispersion characteristic E2. The remaining, inner fingers 220 have dispersion E1. The gaps have dispersion U2, while the remaining portion (external region) has dispersion U1. The cut-off frequency of U1 is the highest, followed by U2, E1 and E2, in that order. The mode-shapes of the two fundamental modes are illustrated below the dispersion graph.

In the simulated example of FIG. 21, the separation between the even and odd eigenfrequencies is increased, compared with a case where all the electrode fingers are identical. This widens the pass-band bandwidth, in filter-design tents. The increased separation occurs because the modification of the outer fingers causes a reduction in the eigenfrequency of the lowest frequency (even) mode. This is also associated with a more nearly uniform wave-function across the interior fingers of the LBAW device (see the bottom plot of FIG. 21).

Figure 22:
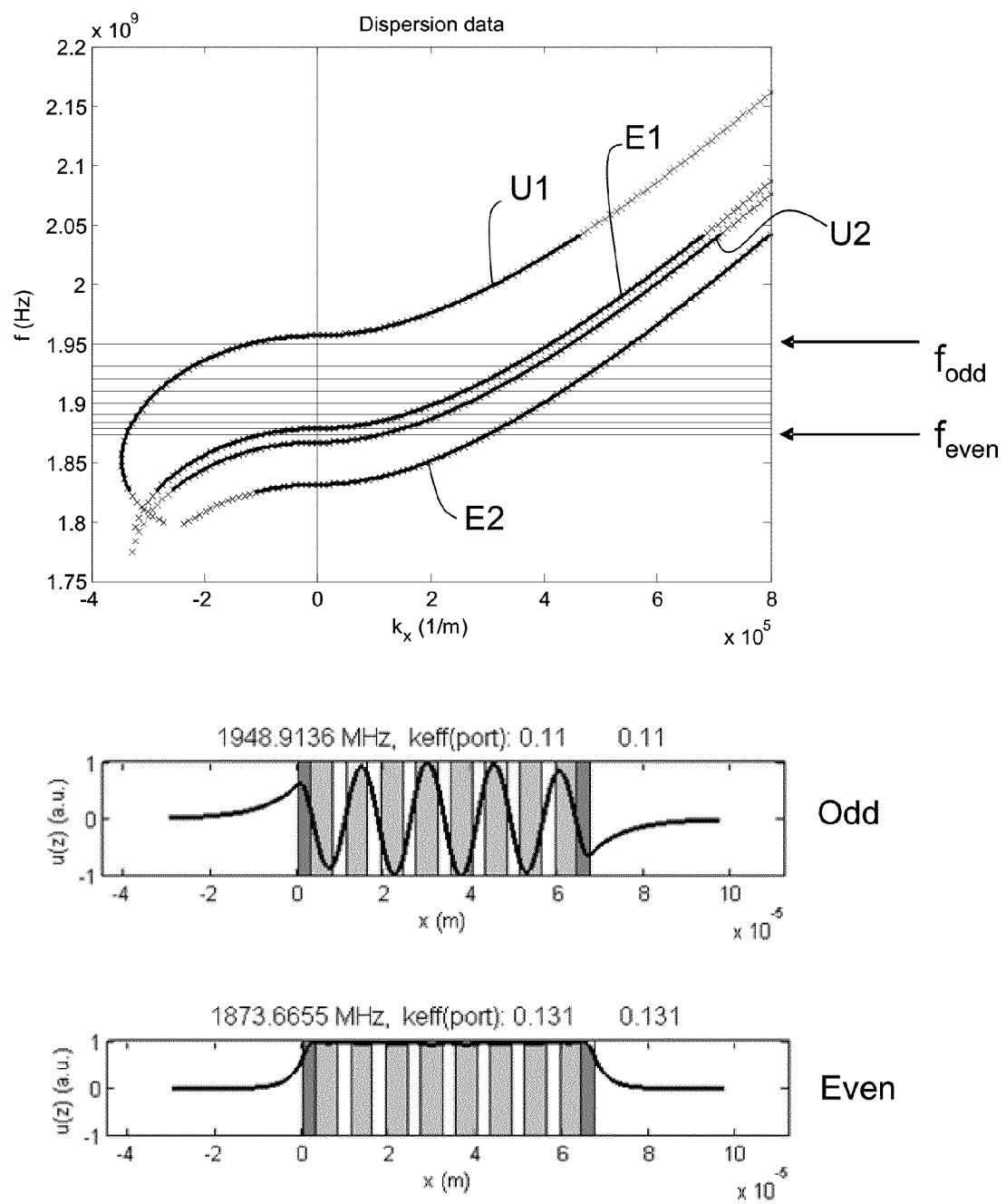
FIG. 22 shows dispersion curves and mode-shapes for a different embodiment.

The example of FIG. 22 differs from FIG. 21 in that the dispersion E1 of the inner fingers 220 has a higher cut-off frequency than the dispersion U2 of the gaps. This provides an even more uniform mode-shape. The eigenfrequency of the even eigenmode is even lower and so the separation of even and odd fundamental eiqenfrequencies is further increased.

These conditions on cut-off frequency apply to devices having Type-I dispersion. They can be re-stated more generally, in terms of the wave number, as follows. Referring to FIG. 21, for example, the dispersion characteristic E1 for the inner fingers presents a real-valued wave number at the eigenfrequencies of interest. For the external region, the characteristic U1 exhibits an imaginary wave number. This is as described previously for the first aspect of the invention. The corresponding wave numbers in the gap region are real (see U2)—to the extent that U2 matches E1. This is as described previously for the second aspect of the invention. The wave numbers of the modified outermost fingers are also real (see E2), but with values greater than either the inner electrodes or the gap region U2. This corresponds to a sinusoidal wave function with a shorter wavelength.

Modification of the outer edges of the electrode portions may be of particular benefit if the total width of the LBAW device is small. In an interdigitated layout, this may be because the number of fingers is low, or because the fingers and gaps are relatively narrow. The definition of "small" depends on the actual dispersion characteristics. In the context of the exemplary dispersion curves presented here, a total width of less than 30 microns can be considered small. However, where dispersion curves are steeper, wider devices than this may still be considered small.

As discussed already above, in the context of the first and second aspects of the invention, modification of the dispersion characteristic can be achieved by modifying the layer structure in the relevant portion of the LBAW device. The examples of FIGS. 17-20 use a frame region, where either the finger tips; part of the outermost fingers; or both are adapted.

For Type-I dispersion, the frame region should have a reduced cut-off frequency. This can be achieved, for example, by depositing an extra layer on top of the peripheral portions. Such a layer may be conducting or non-conducting. If it is conducting it may comprise part of the electrode. By now, it will be apparent to the skilled person that, to implement this aspect for Type-II dispersion, the cut-off frequency of the peripheral regions should instead be greater than that of the rest of the electrode fingers.

A fourth aspect of the invention provides a method of manufacturing both regular BAW devices, which typically have a single electrode on top of the active layer and LBAW devices (such as those according to the first to third aspects of the invention), which have multiple electrodes. The method enables precise control over the layer thicknesses of the different parts of the device. It also provides independent control of the dispersion characteristics in all portions of the device. The processes and materials described may be particularly beneficial for narrowband filter applications.

FIG. 16 has already illustrated one example of the method, for the case of a LBAW device, with two electrodes above the piezoelectric layer. Three further examples of such methods will now be described, with reference to FIGS. 23-25. These illustrate the case of a BAW device in which the remaining portion of the device (around the electrode) is loaded with dielectric, in order to achieve the desired dispersion characteristics.

FIGS. 23A-G show the stages in a first example method of manufacturing a BAW device according to the fourth aspect of the invention. Step A shows the starting point for the method. An active layer 510 is provided, with an upper conductive electrode layer 520 and a lower conductive electrode layer 530. On top of the electrode layer 520 there is a stop-layer 570. The processing method will adapt the layer structure above the active layer 510, to achieve the desired acoustic dispersion properties.

In this example, active layer 510 is a piezoelectric layer—in particular, aluminium nitride (AlN). However, other suitable electro-acoustic transducer materials may be substituted, as will be well known to those skilled in the art.

The conductive layer 520 which will form the top electrode is made of aluminium (Al). Aluminium is a good material for the top electrodes, because of its low density. The electrodes will be relatively light, and so matching of cutoff frequencies can be achieved without needing excessively thick dielectric filling materials in the gap (in the case of an LBAW device). Furthermore, Al is a good conductor. This is important in structures with narrow fingers (such as the lateral acoustically coupled resonators described previously above). The stop-layer 570 is formed of titanium tungsten.

In step B, the stop layer 570 and conductive layer 520 are patterned. Conventional photolithographic techniques are used for the patterning; however, the etching is performed in two stages. FIG. 23B shows the result of the first stage, which is an anisotropic etch step. This may be, for example, dry etching in a gas mixture containing chlorine ($Cl_2$).

As shown in FIG. 23B, when the AlN active layer has almost been reached, the plasma is switched off. The $Cl_2$ will then: continue to etch the Al; however, the selectivity towards AlN is very good, since AlN is only etched by the physical sputtering component of the etching. Once the plasma is switched off, the etching becomes isotropic. The remaining thickness of the Al layer 520 to be etched is removed, without damage to the underlying AlN active layer. The result is shown in FIG. 23C, where the top electrode 520 is in its final form. Patterning the stop-layer 570 and conductive layer 520 in this way avoids the problem of over-etching and the associated uncontrolled shift of the dispersion curve of the non-electrode region to a higher cutoff frequency.

In FIG. 23D, a dielectric layer 550 is deposited over the resulting structure. This covers the stop-layer 570, and the electrode 520. There are no precise requirements on the materials of the dielectric layer. However, the intrinsic acoustic quality factor should be well above 1500. By way of example, silicon dioxide ($SiO_2$), silicon nitride (SiN), and aluminium nitride (AlN) could all be used. In this example, the deposited dielectric layer 550 has a thickness less than that of the electrode 520.

The portion 550b of the dielectric layer over the electrode 520 now needs to be removed. This is done by planarization. In particular, in the present example, it is done by a Chemical-Mechanical Polishing (CMP) process. When the dielectric layer 550b has been removed, the stop-layer 570 is exposed and the planarization stops. This is shown in FIG. 23E. In this way, the Al electrode 520 is protected against unwanted thinning due to the CMP process.

The TiW stop-layer is now easily removed by etching in a hydrogen peroxide solution. This will not etch the remaining $SiO_2$ dielectric 550a or the Al electrode 520, so there is no risk of changing the thicknesses of these layers.

Finally, additional layers 523 may be applied and patterned on the exposed electrode. This may correspond, for example, to the frame regions already described above for LBAW devices. These additional layers 523 could be conductive or non-conductive.

In the example of FIG. 23, the dielectric layer 550a is thinner than the electrode 520. This will commonly be the case for a Type-I dispersion characteristic. For Type-II dispersion, the dielectric layer will usually need to be thicker than the electrode 520. FIG. 24 illustrates the fabrication of such a device.

Steps A-C are the same as for FIG. 23. However, as shown in FIG. 24D, a thicker layer of dielectric 552 is deposited over the whole device. When the planarization is performed, both the dielectric 552b over the electrode and some of the dielectric 552a directly on the active layer (in the remaining portion of the device) are removed. Thus, the top surface of the stop layer 570 determines the thickness of the dielectric layer 552a.

The stop-layer 570 is removed by etching, leading to FIG. 24F. Comparing FIGS. 24E and 24F, it can be seen that the thickness of the stop-layer 570 determines the difference in thickness between the dielectric layer 552a and the electrode 520.

In a Type-II device, if a frame region is required around the periphery of the electrode 520, it will usually be thinner than the interior. This can be achieved by depositing an additional layer 523 on the interior of the electrode and patterning it to remove it from the frame region around the edge. The result is shown in FIG. 24G. The additional layer 523 may be conductive or non-conductive.

Another alternative manufacturing process is illustrated in FIG. 25. Here two dielectric layers 553 and 554 are deposited, instead of just one (FIG. 25D). The combined thickness of these two layers is greater than that of the electrode 520. The CMP planarization process then removes part of the second dielectric layer 554a, which is uppermost in the layer stack of the remaining portion of the BAW device. The first dielectric layer 553a underneath is not exposed. Therefore, the thickness of the first dielectric layer 553a is determined by its deposition, whereas the thickness of the second dielectric layer 554a is determined by the planarization step.

In this example, the first dielectric layer 553a is tantalum pentoxide ($Ta_2O_5$) and the second is $SiO_2$. The acoustic impedance of tantalum pentoxide is 2.5 times higher than silicon dioxide. Other materials and combinations may also be used—for example, combinations of silicon dioxide with silicon oxycarbide (SiOC), which has 3 times lower impedance. By changing the individual layer thicknesses, the dispersion characteristics can be influenced.

Similarly, two layers of dielectric can be deposited in a device like that shown in FIG. 23 (replacing single dielectric layer 550 with a bi-layer). Small shifts in the dispersion curve of the non-electrode area (the remaining portion of the device) can then be realized by depositing only a limited amount of dielectric material. This can be less than the combined thickness of the electrode 520 and stop-layer 570). It is then planarized to achieve precise control of thickness and hence dispersion.

In both FIG. 24 and FIG. 25 it can be seen that a thicker stop-layer 570 gives both a thicker dielectric layer and a greater difference between the thicknesses of the dielectric layer and the electrode 520. Increasing the thickness of the layers shifts the dispersion curve (including the cutoff frequency) downward in frequency.

In an additional, optional step, the dispersion curve of the electrode portion can be modified by adding (and controlling the thickness of) an extra layer in the electrode stack. For example, the additional layer can be of titanium nitride (TiN). The acoustic impedance of TiN is more than 3 times higher than the acoustic impedance of Al. Therefore, adding the TiN layer will shift the dispersion curve to lower frequencies faster than simply increasing the thickness of an Al electrode. For an LBAW device, which has multiple electrodes, the use of this additional TiN on top of the Al electrode is especially useful if the dielectric material in the gap is $SiO_2$. The acoustic properties of Al and $SiO_2$ are very similar. Therefore, in order to make a reasonable difference in cutoff frequency between the electroded and gap region a very large difference in thickness is required between the Al in the electroded region and the $SiO_2$ in the gap region, if only Al is used as electrode material. By the addition of TiN (or another heavier material) one can keep the layers thin.

Dry etching can be used to pattern the TiN layer. This dry etch also etches Al and TiW. The TiN layer can be the top layer of the electrode stack. In this case it may be both the stop-layer for CMP planarization and responsible for achieving the desired dispersion characteristic in the electrode portion. This means that the stop-layer is no longer a sacrificial layer, but is part of the finished device.

Alternatively, the additional layer could be placed deeper in the electrode layer stack: for example, sandwiched between two Al layers. It is not preferred to place it at the bottom of the electrode stack, due to the risk of over-etching. This is because of the inhomogeneity of the dry etch, which could etch the underlying AlN and therefore change the cutoff frequency of the non-electrode region.

The methods of FIGS. 23-25 can be used to make LBAW devices, by forming a second electrode when patterning the conductive layer 520. By default, in the absence of additional processing steps, the layer structure in the gap between these electrodes will be identical to the remaining portion of the device surrounding them. However, it may be advantageous, as described previously above, to provide different layer structures in these two regions. Examples of this have already been shown in FIGS. 14, 19, and 20. To achieve this, the manufacturing process can be modified to include one additional patterning (mask and etching) step. This can be used to partially (or fully) etch the dielectric layer in the remaining portion of the device, leaving a greater height of dielectric in the gap portion than in the remaining portion. FIG. 14 shows an example of this kind. Note also that an optional additional layer in the electrode, as described above, may be particularly useful in LBAW devices. A TiN layer, for example, can be used to achieve significant downward shifts of the dispersion curve in the electrode region.

It is also possible to etch the AlN active layer in the external region (remaining portion) of the device, to further shift the dispersion characteristic of that region compared with the gap (and electrode) regions.

The following strategy can be used to choose the various layer thicknesses to achieve a desired frequency response. This example refers to the laterally acoustically coupled BAW, but it can also be applied to regular BAW design.

1. (Optional, depending on whether multiple layers are used in the electrode) Choose the thickness of the TiN layer in the electrode portion so that there is a sufficient margin in the non-electrode regions—that is, so that the cutoff frequency of the electrode region is low enough compared with that of the non-electrode region. The wavenumber in the gap region should be imaginary over the complete frequency range of interest. The cutoff frequency of the electrode portions should be between the TS2 frequency and the cutoff frequency of the non-electrode portions. The TS2 frequency is the frequency at which the second thickness shear resonance occurs.

2. Next, select the AlN active layer 510 thickness so that the resonance frequency in the electrode portions is at the desired frequency.

3. Adjust the top layer of the reflector stack to optimize the steepness of the dispersion curve of the electrode area, in order to suppress potential spurious modes. For LBAW devices as well as for normal BAW devices the widths of the electrode region, the gap region and the frame region must be carefully designed based on the lateral wavelength of the dominant acoustic mode. This wavelength is governed by the difference between cutoff frequencies of the various regions and by the steepness of the dispersion curve. As will be well known to those skilled in the art, it is the topmost layer of the reflector stack that largely dominates this steepness.

4. Adjust the thickness of the sacrificial CMP stop-layer 570 so that the TS2 frequency of the non-electrode portions is well below the cutoff frequency of the electrode portions. This ensures that the wavenumber in the gap region is imaginary over the frequency range of interest.

Those skilled in the art will recognise that, although they have been described separately, the features of the various aspects of the invention can be used together in embodiments, with beneficial effect.

Various other modifications will apparent to those skilled in the art.

Although the description and claims refer to "imaginary" and "real" wave numbers, in practice, in general, wave numbers will not be purely real or imaginary. In this context, an imaginary wave number can be defined as one in which the imaginary component is greater than or equal to approximately 5 times the real component. Likewise, a real wavenumber is considered to be one in which the real component is approximately 5 times the imaginary component, or greater.

The invention claimed is:

1. A method of manufacturing a Bulk Acoustic Wave device, comprising:
   providing an active layer formed of a piezoelectric transducer material;
   providing a first electrode on the active layer, defining a first electrode portion of the device, whereby a remaining portion of the device is defined around the first electrode;

providing a stop-layer on the first electrode to obtain a resultant structure;

depositing a first dielectric layer on the resultant structure; and planarizing the first dielectric layer until at least a portion of the stop-layer on the first electrode is exposed.

2. The method of claim 1, further comprising removing the stop-layer by etching.

3. The method of claim 1, wherein a deposited thickness of the first dielectric layer in the remaining portion is less than a thickness of the first electrode.

4. The method of claim 1, wherein a deposited thickness of the first dielectric layer in the remaining portion is greater than a thickness of the first electrode.

5. The method of claim 4, wherein the deposited thickness of the dielectric layer in the remaining portion is greater than a combined thickness of the first electrode and the stop-layer, whereby part of the dielectric layer in the remaining portion is removed by the planarization.

6. The method of claim 1, wherein the step of providing the first electrode comprises:

providing a conductive layer on the active layer; and patterning the conductive layer by etching to define the first electrode, wherein the etching of the conductive layer includes:

a first anisotropic etching step; followed by a second isotropic etching step.

7. The method of claim 1, further comprising depositing a second dielectric layer on the first dielectric layer, wherein the second dielectric layer is formed of a material having a different acoustic impedance than the first dielectric layer.

8. The method of claim 1, further comprising depositing an additional layer on the first electrode.

9. The method of claim 1, wherein the Bulk Acoustic Wave device is adapted for acoustic coupling of signals at frequencies in a desired pass-band, and wherein a thickness of the first dielectric layer in the remaining portion is adapted such that the wave number for at least one desired eigenmode having an eigenfrequency within the pass-band is an imaginary number, so as to increase the quality factor of said desired eigenmode and reduce insertion loss in the pass-band.

10. The method of claim 1, further comprising providing a second electrode on the active layer, defining a second electrode portion of the device, whereby a gap portion of the device is defined between the first and second electrodes and the remaining portion of the device is defined around the electrodes.

11. The method of claim 10, further comprising adjusting a thickness of the first dielectric layer in the gap portion or a thickness of the first dielectric layer in the remaining portion, so that they are different.

12. The method of claim 10, wherein the Bulk Acoustic Wave device is adapted for acoustic coupling of signals at frequencies in a desired pass-band, wherein a thickness of the first dielectric layer in the gap portion is adapted such that the wave number for at least one desired eigenmode having an eigenfrequency within the pass-band is a real number.

13. The method of claim 1, wherein planarizing the first dielectric layer comprises Chemical Mechanical Polishing (CMP).

\* \* \* \* \*